United States Patent [19]

Suzuki et al.

[11] Patent Number: 6,009,352
[45] Date of Patent: Dec. 28, 1999

[54] PARAMETER GENERATING DEVICE FOR PART MOUNTING PROGRAM AND STORAGE MEDIUM

[75] Inventors: Takashi Suzuki; Kiyomi Inugai, both of Yamagata, Japan

[73] Assignee: Yamagata Casio Co., Ltd., Higashine, Japan

[21] Appl. No.: 08/955,018

[22] Filed: Oct. 20, 1997

[30] Foreign Application Priority Data

Nov. 27, 1996 [JP] Japan .................................. 8-316355

[51] Int. Cl.⁶ ...................................................... B60P 1/04
[52] U.S. Cl. .......................................... 700/108; 700/121
[58] Field of Search ...................... 364/468.28, 468.15; 395/500.05, 500.1; 29/837

[56] References Cited

U.S. PATENT DOCUMENTS

| | | | |
|---|---|---|---|
| 4,805,110 | 2/1989 | Takahashi et al. | 364/468.28 |
| 5,313,401 | 5/1994 | Kasai et al. | 364/474.02 |
| 5,317,802 | 6/1994 | Jyoko | 29/832 |
| 5,329,690 | 7/1994 | Tsuji et al. | 29/701 |
| 5,671,527 | 9/1997 | Asai et al. | 29/740 |
| 5,924,192 | 7/1999 | Wuyts | 29/833 |

*Primary Examiner*—William Grant
*Assistant Examiner*—Zoila Cabrera
*Attorney, Agent, or Firm*—Frishauf, Holtz, Goodman, Langer & Chick, P.C.

[57] ABSTRACT

The present invention automatically sets an optimum combination for efficiently picking up parts. A plurality of possible combinations of parts to be picked up when the parts are picked up by a plurality of heads, are input to a RAM 4 in the form of a table as quantity conditions and pick up conditions represented by identifiers and part symbols, and are sequentially provided to a CPU 1. The CPU 1 assigns the parts to be actually placed, which are included in the part table, to the part symbols; generates an evaluation table; registers an optimum combination whose evaluation is the highest to the RAM 4; removes that combination from the part table; reassigns the remaining parts in the part table after the removal operation to the part symbols of the search conditions; and repeats the generation of the evaluation table, registration of the optimum combination, and the removal of the combination from the part table. As a result, the CPU 1 sequentially extracts all of the parts included in the initial part table as the optimum combinations, and sequentially registers these combinations to the RAM 4. Consequently, data (parameters) of optimum combinations of parts to be picked up can be automatically obtained based on the part table. This data is used for a part mounting program instead of manually input combination data.

3 Claims, 30 Drawing Sheets

| PART TYPE | NOZZLE TYPE AND WHETHER OR NOT TO ENABLE PICK UP | | | | | | | | QUANTITY | SUPPLY TYPE | SUPPLY NUMBER |
|---|---|---|---|---|---|---|---|---|---|---|---|
| | P2 | P2 | P7 | P7 | P07 | P07 | 31 | 32 | | | |
| AAA | ○ | ○ | | | | | | | 6 | 8 mm | ○ |
| BBB | ○ | ○ | | | | | | | 4 | 8 mm | ○ |
| CCC | ○ | ○ | | | | | | | 3 | 8 mm | ○ |
| DDD | ○ | ○ | | | | | | | 2 | 8 mm | ○ |
| EEE | | | ○ | ○ | | | | | 2 | 16 mm | ○ |
| FFF | | | ○ | ○ | | | | | 2 | 12 mm | ○ |
| GGG | | | | | | | ○ | | 2 | 24 mm | ○ |
| HHH | ○ | ○ | | | | ○ | | | 1 | 8 mm | ○ |
| III | ○ | ○ | | | ○ | | | | 1 | 12 mm | ○ |

FIG. 2

| | |
|---|---|
| OPERATING CONDITION | TWO PARTS ARE PICKED UP BY TWO HEADS |
| IDENTIFIER | P 1 1 (2) |
| PICK UP STATE ILLUSTRATION | A ⬯ ... B ⬯ |
| QUANTITY CONDITION | A = B + REMAINDER |
| PICK UP CONDITION | A AND B ARE PICKED UP BY DIFFERENT NOZZLES |

F I G. 5

| | | |
|---|---|---|
| OPERATING CONDITION | TWO PARTS ARE PICKED UP BY TWO HEADS, REMAINDER A IS PICKED UP BY TWO HEADS WHICH MOVE | |
| IDENTIFIER | P121_1(2) | P211_1(2) |
| PICK UP STATE ILLUSTRATION | B...A ⊚ ⊚ ⊚ ⊚ | A...B ⊚ ⊚ ⊚ ⊚ |
| QUANTITY CONDITION | (A-B)/2 > 0 AND REMAINDER OF 2 OF (A-B) IS 0 | |
| PICK UP CONDITION | B AND A ARE PICKED UP BY DIFFERENT NOZZLES A IS PICKED UP BY DIFFERENT NOZZLE A AND B ARE PICKED UP BY SAME NOZZLE | |

F I G. 8

| OPERATING CONDITION | THREE PARTS ARE PICKED UP BY TWO HEADS |
|---|---|
| IDENTIFIER | P 1 2 1 (3) |
| PICK UP STATE ILLUSTRATION | B　　A　　C<br>○‧‧‧‧○<br>　　○‧‧‧‧○ |
| QUANTITY CONDITION | (A − B) = C + REMAINDER AND A > B > C |
| PICK UP CONDITION | B AND A ARE PICKED UP BY DIFFERENT NOZZLES<br>A AND C ARE PICKED UP BY DIFFERENT NOZZLES<br>B AND A ARE PICKED UP BY SAME NOZZLE<br>A AND C ARE PICKED UP BY SAME NOZZLE |

F I G. 9 A

| OPERATING CONDITION | THREE PARTS ARE PICKED UP BY TWO HEADS, ONE COMBINATION CANNOT BE SIMULTANEOUSLY PICKED UP |
|---|---|
| IDENTIFIER | P 2 1 1 (3) |
| PICK UP STATE ILLUSTRATION | A　　　B C<br>○‧‧‧‧○<br>○　　　○ |
| QUANTITY CONDITION | (A − B) = C + REMAINDER |
| PICK UP CONDITION | B AND A ARE PICKED UP BY DIFFERENT NOZZLES<br>A AND C ARE PICKED UP BY DIFFERENT NOZZLES<br>B AND C ARE PICKED UP BY SAME NOZZLE |

| OPERATING CONDITION | THREE PARTS ARE PICKED UP BY TWO HEADS, REMAINING C IS PICKED UP BY TWO HEADS WHICH MOVE |
|---|---|
| IDENTIFIER | P1221_1 (3) |
| PICK UP STATE ILLUSTRATION | B A C ○... ○ ○ ...◎ ◎ ◎ |
| QUANTITY CONDITION | (A-B) < C AND (C-(A-B))/2 > 0 AND REMAINDER OF 2 OF (C-(A-B)) IS 0 |
| PICK UP CONDITION | B AND A ARE PICKED UP BY DIFFERENT NOZZLES A AND C ARE PICKED UP BY DIFFERENT NOZZLES C IS PICKED UP BY DIFFERENT NOZZLE B,A AND C ARE PICKED UP BY SAME NOZZLE A AND C ARE PICKED UP BY SAME NOZZLE |

FIG. 10B

| OPERATING CONDITION | THREE PARTS ARE PICKED UP BY TWO HEADS, TWO COMBINATIONS ARE SIMULTANEOUSLY PICKED UP, REMAINING A IS PICKED UP BY TWO HEADS WHICH MOVE |
|---|---|
| IDENTIFIER | P1311_1 (3) |
| PICK UP STATE ILLUSTRATION | B A C ○... ◎ ◎ ...○ ◎ ◎ |
| QUANTITY CONDITION | (A-(B+C))/2 > 0 AND REMAINDER OF 2 OF (A-(B+C)) IS 0 |
| PICK UP CONDITION | A AND B ARE PICKED UP BY DIFFERENT NOZZLES A AND C ARE PICKED UP BY DIFFERENT NOZZLES A IS PICKED UP BY DIFFERENT NOZZLE A AND C ARE PICKED UP BY SAME NOZZLE B AND A ARE PICKED UP BY SAME NOZZLE |

FIG. 10C

| OPERATING CONDITION | THREE PARTS ARE PICKED UP BY TWO HEADS, ONE COMBINATION IS SIMULTANEOUSLY PICKED UP, REMAINING A IS PICKED UP BY TWO HEADS WHICH MOVE |
|---|---|
| IDENTIFIER | P3111_1 (3) |
| PICK UP STATE ILLUSTRATION | A B C ◎... ○ ◎ ○ ◎ ◎ |
| QUANTITY CONDITION | (A-(B-C))/2 > 0 AND REMAINDER OF 2 OF (A-(B+C)) IS 0 |
| PICK UP CONDITION | A AND B ARE PICKED UP BY DIFFERENT NOZZLES A AND C ARE PICKED UP BY DIFFERENT NOZZLES A IS PICKED UP BY DIFFERENT NOZZLE A,B AND C ARE PICKED UP BY SAME NOZZLE |

FIG. 11A

| OPERATING CONDITION | FOUR PARTS ARE PICKED UP BY TWO HEADS |
|---|---|
| IDENTIFIER | P 1 2 2 1 (4) |
| PICK UP STATE ILLUSTRATION | B    A    C    D<br>○···○<br>　　○···○<br>　　　　○···○ |
| QUANTITY CONDITION | (A−B) < C AND (C−(A−B))= D + REMAINDER AND A > B > C > D |
| PICK UP CONDITION | B AND A ARE PICKED UP BY DIFFERENT NOZZLES<br>A AND C ARE PICKED UP BY DIFFERENT NOZZLES<br>C AND D ARE PICKED UP BY DIFFERENT NOZZLES<br>B, A AND C ARE PICKED UP BY SAME NOZZLE<br>A, C AND D ARE PICKED UP BY SAME NOZZLE |

FIG. 11B

| OPERATING CONDITION | FOUR PARTS ARE PICKED UP BY TWO HEADS, TWO COMBINATIONS ARE SIMULTANEOUSLY PICKED UP |
|---|---|
| IDENTIFIER | P 1 3 1 1 (4) |
| PICK UP STATE ILLUSTRATION | B    A    C D<br>○···○<br>　　○···○<br>　　○　　○ |
| QUANTITY CONDITION | A = B + C + D + REMAINDER |
| PICK UP CONDITION | A AND B ARE PICKED UP BY DIFFERENT NOZZLES<br>A AND C ARE PICKED UP BY DIFFERENT NOZZLES<br>A AND D ARE PICKED UP BY DIFFERENT NOZZLES<br>A, C AND D ARE PICKED UP BY SAME NOZZLE<br>B AND A ARE PICKED UP BY SAME NOZZLE |

FIG. 11C

| OPERATING CONDITION | FOUR PARTS ARE PICKED UP BY TWO HEADS, COMBINATIONS OTHER THAN ONE COMBINATION CANNOT BE SIMULTANEOUSLY PICKED UP |
|---|---|
| IDENTIFIER | P 3 1 1 1 (4) |
| PICK UP STATE ILLUSTRATION | A       B C D<br>○···○<br>○　　○<br>○　　○ |
| QUANTITY CONDITION | A = B + C + D + REMAINDER |
| PICK UP CONDITION | A AND B ARE PICKED UP BY DIFFERENT NOZZLES<br>A AND C ARE PICKED UP BY DIFFERENT NOZZLES<br>A AND D ARE PICKED UP BY DIFFERENT NOZZLES<br>B, C AND D ARE PICKED UP BY SAME NOZZLE |

FIG. 12

| No. | COMBINATION OF PARTS | | | | TOTAL NUMBER | REQUEST EVALU- ATION | SIMULTANEOUS PICK UP EVALUATION | SAME SUPPLY EVALUATION | OVERALL EVALUATION | EVALUATION LEVEL |
|---|---|---|---|---|---|---|---|---|---|---|
| | A | B | C | D | | | | | | |
| 1 | AAA | BBB | CCC | HHH | 14 | 6 | 14 | 14 | 34 | 2.43 |
| 2 | AAA | BBB | CCC | III | 14 | 6 | 14 | 16 | 36 | 2.57 |
| 3 | BBB | CCC | DDD | HHH | 10 | 10 | 10 | 10 | 30 | 3.00 |
| 4 | BBB | CCC | DDD | III | 10 | 10 | 10 | 12 | 32 | 3.20 |
| 5 | BBB | CCC | FFF | HHH | 10 | 10 | 10 | 14 | 34 | 3.40 |
| 6 | BBB | CCC | FFF | III | 10 | 12 | 10 | 12 | 32 | 3.20 |
| 7 | CCC | DDD | FFF | HHH | 8 | 12 | 8 | 12 | 32 | 4.00 ← OPTIMUM |
| 8 | CCC | DDD | FFF | III | 8 | 12 | 8 | 10 | 30 | 3.75 |

| | | | | |
|---|---|---|---|---|
| OPERATING CONDITION | FOUR PARTS ARE PICKED UP BY TWO HEADS, REMAINING D IS PICKED UP BY TWO HEADS WHICH MOVE | FOUR PARTS ARE PICKED UP BY TWO HEADS, TWO COMBINATIONS ARE SIMULTANEOUSLY PICKED UP, REMAINING A IS PICKED UP BY TWO HEADS WHICH MOVE | FOUR PARTS ARE PICKED UP BY TWO HEADS, ONE COMBINATION IS SIMULTANEOUSLY PICKED UP, REMAINING A IS PICKED UP BY TWO HEADS WHICH MOVE |
| IDENTIFIER | P12221_1 (4) | P14111_1 (4) | P41111_1 (4) |
| PICK UP STATE ILLUSTRATION | B  A  C  D<br>○····○<br>○····◎<br>◎ | B  A  C  D<br>○····○<br>◎····○<br>◎<br>◎ | A  B  C  D<br>◎····○<br>◎  ○<br>◎<br>◎ |
| QUANTITY CONDITION | (A−B)<C AND (C−(A−B))<D AND (D−(C−(A−B)))/2>0 AND REMAINDER OF 2 OF(D−(C−(A−B)))IS 0 | (A−(B+C+D))/2 > 0 AND REMAINDER OF 2 OF (A−(B+C+D)) IS 0 | (A−(B+C+D))/2 > 0 AND REMAINDER OF 2 OF A−(B+C+D) IS 0 |
| PICK UP CONDITION | B AND A ARE PICKED UP BY DIFFERENT NOZZLES<br>A AND C ARE PICKED UP BY DIFFERENT NOZZLES<br>C AND D ARE PICKED UP BY DIFFERENT NOZZLES<br>D IS PICKED UP BY DIFFERENT NOZZLE<br>B,A,C AND D ARE PICKED UP BY SAME NOZZLE<br>A,C AND D ARE PICKED UP BY SAME NOZZLE | A AND B ARE PICKED UP BY DIFFERENT NOZZLES<br>A AND C ARE PICKED UP BY DIFFERENT NOZZLES<br>A AND D ARE PICKED UP BY DIFFERENT NOZZLES<br>A IS PICKED UP BY DIFFERENT NOZZLE<br>A,C AND D ARE PICKED UP BY SAME NOZZLE<br>B AND A ARE PICKED UP BY SAME NOZZLE | A AND B ARE PICKED UP BY DIFFERENT NOZZLES<br>A AND C ARE PICKED UP BY DIFFERENT NOZZLES<br>A AND D ARE PICKED UP BY DIFFERENT NOZZLES<br>A IS PICKED UP BY DIFFERENT NOZZLE<br>B,A,C AND D ARE PICKED UP BY SAME NOZZLE |

F I G. 1 4

| OPERATING CONDITION | FIVE PARTS ARE PICKED UP BY TWO HEADS | FIVE PARTS ARE PICKED UP BY TWO HEADS, BUT ONLY TWO COMBINATIONS ARE SIMULTANEOUSLY PICKED UP | | FIVE PARTS ARE PICKED UP BY TWO HEADS, ONE COMBINATION IS SIMULTANEOUSLY PICKED UP |
|---|---|---|---|---|
| IDENTIFIER | P 12221  (5) | P 14111  (5) | P 11411  (5) | P 41111 1  (5) |
| PICK UP STATE ILLUSTRATION | B  A  C  D  E<br>O ···O<br>          O ···O | B  A  C  D  E<br>O ···O<br>     O<br>          O ···O | B C  A  D E<br>O<br>   O ···O<br>          O ···O | A  B  C  D  E<br>   O<br>O ···O<br>   O<br>       O<br>              O |
| QUANTITY CONDITION | (A−B)<C AND (C−(A−B))<C AND (D−(C−(A−B)))=E + REMAINDER | A = B + C + D + E + REMAINDER | | |
| PICK UP CONDITION | B AND A ARE PICKED UP BY DIFFERENT NOZZLES<br>A AND C ARE PICKED UP BY DIFFERENT NOZZLES<br>C AND D ARE PICKED UP BY DIFFERENT NOZZLES<br>D AND E ARE PICKED UP BY DIFFERENT NOZZLES<br>B,A,C AND D ARE PICKED UP BY SAME NOZZLE<br>A,C,D AND E ARE PICKED UP BY SAME NOZZLE | A AND B ARE PICKED UP BY DIFFERENT NOZZLES<br>A AND C ARE PICKED UP BY DIFFERENT NOZZLES<br>A AND D ARE PICKED UP BY DIFFERENT NOZZLES<br>A AND E ARE PICKED UP BY DIFFERENT NOZZLES<br>A,C,D AND E ARE PICKED UP BY SAME NOZZLE<br>B AND A ARE PICKED UP BY SAME NOZZLE | A,D AND E ARE PICKED UP BY SAME NOZZLE<br>B,C AND A ARE PICKED UP BY SAME NOZZLE | B,C,D AND E ARE PICKED UP BY SAME NOZZLE |

F I G. 1 5

| | |
|---|---|
| OPERATING CONDITION | FOUR PARTS ARE PICKED UP BY TWO HEADS, TWO COMBINATIONS ARE SIMULTANEOUSLY PICKED UP, REMAINING A IS PICKED UP BY TWO HEADS WHICH MOVE |
| IDENTIFIER | P 1 1 4 1 1 _ 1   (4) |
| PICK UP STATE ILLUSTRATION | B  C   A   D  ◯  ◯  ◎   ◯ ⋯ ◎  ◎ ⋯ ◯  ◎  ◎ |
| QUANTITY CONDITION | $(A-(B+C+D))/2 > 0$ AND REMAINDER OF 2 OF $(A-(B+C+D))$ IS 0 |
| PICK UP CONDITION | A AND B ARE PICKED UP BY DIFFERENT NOZZLES  A AND C ARE PICKED UP BY DIFFERENT NOZZLES  A AND D ARE PICKED UP BY DIFFERENT NOZZLES  A IS PICKED UP BY SAME NOZZLE  A AND D ARE PICKED UP BY SAME NOZZLE  B, C AND A ARE PICKED UP BY SAME NOZZLE |

F I G.  1 6 A

| | |
|---|---|
| OPERATING CONDITION | ONE PART IS PICKED UP BY TWO HEADS WHICH MOVE |
| IDENTIFIER | P 1 1 _ 1  (1) |
| PICK UP STATE ILLUSTRATION | A  ◎  ◎ |
| QUANTITY CONDITION | $A > 1$ |
| PICK UP CONDITION | A IS PICKED UP BY DIFFERENT NOZZLE |

F I G.  1 6 B

| | |
|---|---|
| OPERATING CONDITION | ONE PART IS PICKED UP BY ONE HEAD |
| IDENTIFIER | P1 (1) |
| PICK UP STATE ILLUSTRATION |  |
| QUANTITY CONDITION | NONE |
| PICK UP CONDITION | NOZZLE WHICH CAN PICK UP A EXISTS |

| OPERATING CONDITION | THREE PARTS ARE PICKED UP BY THREE HEADS, ONE COMBINATION IS SIMULTANEOUSLY PICKED UP, REMAINING PARTS ARE PICKED UP BY THREE HEADS WHICH MOVE | | | |
|---|---|---|---|---|
| IDENTIFIER | P1221_3S1_L (3) | P1221_3S1_R (3) | P1221_3S1_M1 (3) | P1221_3S1_M2 (3) |
| PICK UP STATE ILLUSTRATION | A B C<br>◎ ○ ··· ○<br>◎ ○ | C B A<br>○ ··· ○ ◎<br>··· ◎ ○ | B A C<br>○ ◎ ○<br>○ ··· ◎ ○ | C A B<br>○ ··· ○ ○<br>◎ ··· ◎ |
| QUANTITY CONDITION | $A > B > C$ AND $(A-C)/2 + (A-C)\%2 = (B-C)$ | | | |
| PICK UP CONDITION | A, B AND C ARE PICKED UP BY DIFFERENT NOZZLES<br>A AND B ARE PICKED UP BY SAME NOZZLE<br>B AND C ARE PICKED UP BY SAME NOZZLE | | | A, B AND C ARE PICKED UP BY DIFFERENT NOZZLES<br>A AND C ARE PICKED UP BY SAME NOZZLE |

F I G. 19

| OPERATING CONDITION | THREE PARTS ARE PICKED UP BY THREE HEADS, REMAINING PARTS ARE PICKED UP BY THREE HEADS WHICH MOVE | | |
|---|---|---|---|
| IDENTIFIER | P11211_S1_L (3) | P11211_S1_M (3) | P11211_S1_R (3) |
| PICK UP STATE ILLUSTRATION | A  B  C<br>◎ ⋯ ○ ⋯ ○<br>◎◎◎ | B  A  C<br>○ ⋯ ◎ ⋯ ○<br>◎◎◎ | B  C  A<br>○ ⋯ ○ ⋯ ◎<br>◎◎◎ |
| QUANTITY CONDITION | A>B=C AND (A−B)/3>0 AND (A−B)%3!=1 | | |
| PICK UP CONDITION | A,B AND C ARE PICKED UP BY DIFFERENT NOZZLES<br>A IS PICKED UP BY B AND C | | |

F I G.  2 0 A

| OPERATING CONDITION | THREE PARTS ARE PICKED UP BY THREE HEADS, TWO PARTS ARE SIMULTANEOUSLY PICKED UP | |
|---|---|---|
| IDENTIFIER | P11211_S2_L (3) | P11211_S2_R (3) |
| PICK UP STATE ILLUSTRATION | B  A    C<br>○ ⋯ ◎◎   ○<br>     ◎◎ ⋯ ○ | C   A  B<br>    ◎◎ ⋯ ○<br>○ ⋯ ◎◎ |
| QUANTITY CONDITION | (A−B∗2)/2 + (A−B∗2)%2 = C | |
| PICK UP CONDITION | A,B AND C ARE PICKED UP BY DIFFERENT NOZZLES<br>A AND B ARE PICKED UP BY SAME NOZZLE<br>A AND C ARE PICKED UP BY SAME NOZZLE | |

F I G.  2 0 B

| | |
|---|---|
| OPERATING CONDITION | FOUR PARTS ARE PICKED UP BY THREE HEADS, TWO COMBINATIONS ARE SIMULTANEOUSLY PICKED UP |
| IDENTIFIER | P1221_3 (4) |
| PICK UP STATE ILLUSTRATION | C    A    B    D<br>○···○ ···○<br>   ○···○ ···○ |
| QUANTITY CONDITION | A = B + REMAINDER > C AND<br>(B − C) = D + REMAINDER |
| PICK UP CONDITION | C, A AND B ARE PICKED UP BY DIFFERENT NOZZLES<br>C AND A ARE PICKED UP BY SAME NOZZLE<br>A AND B ARE PICKED UP BY SAME NOZZLE<br>B AND D ARE PICKED UP BY SAME NOZZLE |

F I G. 2 1 A

| | | | |
|---|---|---|---|
| OPERATING CONDITION | FOUR PARTS ARE PICKED UP BY THREE HEADS, ONE COMBINATION IS SIMULTANEOUSLY PICKED UP | | |
| IDENTIFIER | P1221_3L (4) | P1221_3M (4) | P1221_3R (4) |
| PICK UP STATE ILLUSTRATION | B    A    D    C<br>○···○ ··· ○<br>○··· ○    ○ | B    C    D    A<br>○···○ ··· ○<br>○  ···  ○    ○ | C    D    B    A<br>○ ··· ○ ···○<br>   ○    ○ ···○ |
| QUANTITY CONDITION | A = B + REMAINDER > C AND<br>(B − C) = D + REMAINDER | | |
| PICK UP CONDITION | C, A AND B ARE PICKED UP BY DIFFERENT NOZZLES<br>C AND D ARE PICKED UP BY SAME NOZZLE | | |

F I G. 2 1 B

| OPERATING CONDITION | FOUR PARTS ARE PICKED UP BY THREE HEADS, ONE COMBINATION IS SIMULTANEOUSLY PICKED UP, REMAINING TWO PARTS ARE PICKED UP BY THREE HEADS WHICH MOVE | | |
|---|---|---|---|
| IDENTIFIER | P11211_S3_L (4) | P11211_S3_R (4) | |
| PICK UP STATE ILLUSTRATION | B C A D<br>○ ... ○ ... ◎ ◎ | D A B C<br>◎ ◎ ... ○ ... ○ | |
| QUANTITY CONDITION | A>B=C AND (A−B)=D/2+D%2 | | |
| PICK UP CONDITION | A,B AND C ARE PICKED UP BY DIFFERENT NOZZLES<br>B AND A ARE PICKED UP BY SAME NOZZLE<br>C AND D ARE PICKED UP BY SAME NOZZLE<br>A AND D ARE PICKED UP BY SAME NOZZLE | A,B AND C ARE PICKED UP BY DIFFERENT NOZZLES<br>C AND A ARE PICKED UP BY SAME NOZZLE<br>B AND D ARE PICKED UP BY SAME NOZZLE<br>A AND D ARE PICKED UP BY SAME NOZZLE | |

FIG. 22

| OPERATING CONDITION | FOUR PARTS ARE PICKED UP BY THREE HEADS, TWO COMBINATIONS CAN BE SIMULTANEOUSLY PICKED UP, REMAINING PARTS ARE PICKED UP BY THREE HEADS | |
|---|---|---|
| IDENTIFIER | P11311_L (4) | P11311_R (4) |
| PICK UP STATE ILLUSTRATION | C B A D<br>○ ⋯ ○ ⋯ ◎ ⋯ ○<br>◎◎◎ | C A B D<br>○ ⋯ ◎ ⋯ ○ ⋯ ○<br>◎◎◎ |
| QUANTITY CONDITION | A>B>C AND (B−C)=D AND (A−B)/3>0 AND (A−B)%3 != 1 | |
| PICK UP CONDITION | A,B AND C ARE PICKED UP BY DIFFERENT NOZZLES<br>C,B AND A ARE PICKED UP BY SAME NOZZLE<br>B AND A ARE PICKED UP BY SAME NOZZLE<br>A AND D ARE PICKED UP BY SAME NOZZLE | A,B AND C ARE PICKED UP BY DIFFERENT NOZZLES<br>C AND A ARE PICKED UP BY SAME NOZZLE<br>A AND B ARE PICKED UP BY SAME NOZZLE<br>B,D AND A ARE PICKED UP BY SAME NOZZLE |

F I G. 2 3

| OPERATING CONDITION | FIVE PARTS ARE PICKED UP BY THREE HEADS, ALL PARTS ARE SIMULTANEOUSLY PICKED UP |
|---|---|
| IDENTIFIER | P 1 2 3 2 1   (5) |
| PICK UP STATE ILLUSTRATION | C   B   A   D   E<br>○ ···○ ···○<br>        ○ ···○ ···○<br>        ○ ···○ ···○ |
| QUANTITY CONDITION | A>(B-C) AND (A-C)=D AND (A-E)=B |
| PICK UP CONDITION | A,B AND C ARE PICKED UP BY DIFFERENT NOZZLES<br>C,B AND A ARE PICKED UP BY SAME NOZZLE<br>B,A AND D ARE PICKED UP BY SAME NOZZLE<br>A,D AND E ARE PICKED UP BY SAME NOZZLE |

FIG. 24A

| OPERATING CONDITION | FIVE PARTS ARE PICKED UP BY THREE HEADS, TWO COMBINATIONS ARE SIMULTANEOUSLY PICKED UP |
|---|---|
| IDENTIFIER | P 1 1 2 1 1   (5) |
| PICK UP STATE ILLUSTRATION | B   C   A   D   E<br>○ ···○ ···○<br>        ○ ···○ ···○ |
| QUANTITY CONDITION | A>B=C AND (A-B)=D=E-REMAINDER |
| PICK UP CONDITION | B,C AND A ARE PICKED UP BY DIFFERENT NOZZLES<br>B AND A ARE PICKED UP BY SAME NOZZLE<br>C AND D ARE PICKED UP BY SAME NOZZLE<br>A AND E ARE PICKED UP BY SAME NOZZLE |

FIG. 24B

| OPERATING CONDITION CONDITION | FIVE PARTS ARE PICKED UP BY THREE HEADS, TWO COMBINATIONS ARE SIMULTANEOUSLY PICKED UP, RAMAINING PARTS ARE PICKED UP BY THREE HEADS |
|---|---|
| IDENTIFIER | P 1 1 3 1 1 _M   (5) |
| PICK UP STATE ILLUSTRATION | B   C   A   D   E<br>○ ···○ ···◉<br>        ◉ ···○ ···○<br>        ◉◉◉ |
| QUANTITY CONDITION | A>B=C AND (A-B)>D=E AND (A-(B+D))/3>0<br>AND (A-(B+D))%3 !=1 |
| PICK UP CONDITION | A,B AND C ARE PICKED UP BY DIFFERENT NOZZLES<br>B AND A ARE PICKED UP BY SAME NOZZLE<br>C,D AND A ARE PICKED UP BY SAME NOZZLE<br>A AND E ARE PICKED UP BY SAME NOZZLE |

| OPERATING CONDITION | FIVE PARTS ARE PICKED UP BY THREE HEADS, ONE COMBINATION IS SIMULTANEOUSLY PICKED UP | |
|---|---|---|
| IDENTIFIER | P11211_H11 (5) | P11211_H12 (5) |
| PICK UP STATE ILLUSTRATION | A B C<br>○⋯⋯○⋯⋯○<br>○○⋯⋯○<br>D E | D A E B C<br>○ ○⋯⋯○ ○<br>○⋯⋯○ ○ |
| QUANTITY CONDITION | A>(B=C) AND (A−B)=D=E−REMAINDER | |
| PICK UP CONDITION | A, B AND C ARE PICKED UP BY DIFFERENT NOZZLES<br>B AND D ARE PICKED UP BY SAME NOZZLE<br>C AND E ARE PICKED UP BY SAME NOZZLE | A, B AND C ARE PICKED UP BY DIFFERENT NOZZLES<br>A AND D ARE PICKED UP BY SAME NOZZLE<br>B AND A ARE PICKED UP BY SAME NOZZLE<br>C AND E ARE PICKED UP BY SAME NOZZLE |

| OPERATING CONDITION | FIVE PARTS ARE PICKED UP BY THREE HEADS, ONE COMBINATION IS SIMULTANEOUSLY PICKED UP | | | |
|---|---|---|---|---|
| IDENTIFIER | P11211_H21 (5) | P11211_H22 (5) | P11211_H23 (5) |  |
| PICK UP STATE ILLUSTRATION | B  A D C E<br>○ ⋯○<br>  ○○ ⋯○ | B D A E C<br>○ ⋯○ ⋯○<br>    ○○ | D B E A C<br>○ ⋯○ ⋯○<br>    ○ |  |
| QUANTITY CONDITION | A > (B = C) AND (A − B) = D = E − RAMAINDER | | | |
| PICK UP CONDITION | A,B AND C ARE PICKED UP BY DIFFERENT NOZZLES<br>B AND A ARE PICKED UP BY SAME NOZZLE<br>A AND D ARE PICKED UP BY SAME NOZZLE<br>C AND E ARE PICKED UP BY SAME NOZZLE | A,B AND C ARE PICKED UP BY DIFFERENT NOZZLES<br>B AND D ARE PICKED UP BY SAME NOZZLE<br>C AND E ARE PICKED UP BY SAME NOZZLE | A,B AND C ARE PICKED UP BY DIFFERENT NOZZLES<br>B AND D ARE PICKED UP BY SAME NOZZLE<br>A AND E ARE PICKED UP BY SAME NOZZLE<br>C AND A ARE PICKED UP BY SAME NOZZLE |  |

F I G. 2 6

| OPERATING CONDITION | FIVE PARTS ARE PICKED UP BY THREE HEADS, ONE COMBINATION IS SIMULTANEOUSLY PICKED UP | |
|---|---|---|
| IDENTIFIER | P11211_H32 (5) | P11211_H33 (5) |
| PICK UP STATE ILLUSTRATION | B C D A E<br>O ⋯ O O ⋯ O | B D C E A<br>O ⋯ O ⋯ O O<br>O ⋯ ⋯ ⋯ O |
| QUANTITY CONDITION | A > (B=C) AND (A−B) = D = E−REMAINDER | |
| PICK UP CONDITION | A, B AND C ARE PICKED UP BY DIFFERENT NOZZLES<br>B AND D ARE PICKED UP BY SAME NOZZLE<br>C AND A ARE PICKED UP BY SAME NOZZLE<br>A AND E ARE PICKED UP BY SAME NOZZLE | A, B AND C ARE PICKED UP BY DIFFERENT NOZZLES<br>B AND D ARE PICKED UP BY SAME NOZZLE<br>C AND E ARE PICKED UP BY SAME NOZZLE |

F I G. 27

| OPERATING CONDITION | TWO PARTS ARE PICKED UP BY THREE HEADS, ONE COMBINATION IS SIMULTANEOUSLY PICKED UP | |
|---|---|---|
| IDENTIFIER | P 1 1 1 _ L (2) | P 1 1 1 _ R (2) |
| PICK UP STATE ILLUSTRATION | A   B<br>◎◎ ⋯ ○ | B   A<br>○ ⋯ ◎◎ |
| QUANTITY CONDITION | A / 2 + A % 2 = B | |
| PICK UP CONDITION | A IS PICKED UP BY TWO NOZZLES OTHER THAN B | |

F I G. 3 0 A

| OPERATING CONDITION | TWO PARTS ARE PICKED UP BY THREE HEADS, REMAINING PARTS ARE PICKED UP BY THREE HEADS WHICH MOVE | |
|---|---|---|
| IDENTIFIER | P 11211 _ S4 _ L (3) | P 11211 _ S4 _ R (3) |
| PICK UP STATE ILLUSTRATION | B     A<br>○ ⋯ ◎ ◎◎<br>◎ ◎ ◎ | A     B<br>◎ ◎ ⋯ ○<br>◎ ◎ ◎ |
| QUANTITY CONDITION | A>B AND (A-B*2)/3>0 AND (A-B*2)%3 !=0 | |
| PICK UP CONDITION | A IS PICKED UP BY THREE DIFFERENT NOZZLES<br>B AND A ARE PICKED UP BY SAME NOZZLE | |

F I G. 3 0 B

| OPERATING CONDITION | ONE PART IS PICKED UP BY THREE HEADS |
|---|---|
| IDENTIFIER | P 1 1 1 _ 1 (1) |
| PICK UP STATE ILLUSTRATION | A<br>◎ ◎ ◎ |
| QUANTITY CONDITION | A > 2 |
| PICK UP CONDITION | A IS PICKED UP BY THREE DIFFERENT NOZZLES |

F I G. 3 0 C

PARAMETER GENERATING DEVICE FOR PART MOUNTING PROGRAM AND STORAGE MEDIUM

BACKGROUND OF THE INVENTION

1. Field of the Invention

Conventionally, there is a component pick up and mounting devices (simply referred to as "mounter" hereinafter) for placing electronic parts (simply referred to as "parts" hereinafter) on a circuit board (simply referred to as a "board" hereinafter). The mounter is classified into two major types. One type is implemented by a number of (for example, 16) operating heads (simply referred to as "heads" hereinafter) which circulate, rotate, pick up and place parts. This type is generally called a rotary type. The other is implemented by one or a plurality of heads (normally 2 to 7) arranged on one move support, which pick up and place parts on a board while moving forward and backward, to the right and to the left, and upward and downward. This type is normally called a one-by-one type.

2. Description of the Related Arts

To efficiently place parts on a board with the above described one-by-one type mounter, the amount of movement of a head must be reduced to a minimum. Upward and downward movements for mounting among the movements of the head are intended to pick up and place parts, and essentially arise. Also the forward and backward (in the direction of the Y axis) movements of the head for placing parts are movements between a part supply device and a board placing position, and essentially arise. Since these movements are also essential, it is difficult to reduce the amounts of the movements.

In the meantime, the amounts of movements of a plurality of heads to the left and right (in the direction of the X axis) for picking up parts are affected depending on the positions of parts to be supplied to a head. Additionally, the positions of the parts exactly match the head pitches of the plurality of heads, they can be simultaneously picked up and the amounts of the upward and downward movements of the heads can be reduced. Therefore, supply devices such as a part cassette, a part stick, a part tray etc., are arranged at the optimum positions, so that the amounts of movements to the left and right and also movements of the upward and downward by the plurality of heads must be reduced to a minimum. At the same time, parts must be simultaneously picked up as much as possible. To optimally set the positions of the supply devices, the pick up combination of parts, which allows a plurality of heads to pick up the parts efficiently, must first be determined.

The operations for determining the pick up combination of parts is implemented as follows. That is, all possible combinations of parts to be picked up by nozzles of a plurality of heads are first considered. Then, a combination which seems to be optimum is selected by examining which combination can perform the pick up operations in the shortest time. Supply devices are arranged according to the selected combination so that parts can be picked up. The selected and determined pick up combination of parts must be included into a part mounting program for use in a mounter.

For the above described selection and determination of the pick up combination of parts, actual parts are assigned to possible combinations of parts, and their pick up operations are estimated. Then, a combination which seems to be faster is repeatedly selected. The operations for optimally making a pick up combination of parts were performed manually and were extremely troublesome and complicated. This is because they were performed by trial and error. Since the operations for considering (searching for) a pick up combination of parts were troublesome and time consuming, they impeded improvement of operating efficiency of an entire process in which a new board was designed, a pick up combination of parts was finally determined based on the design of the board, supply devices were arranged based on the determined combination, and a new mounting process was ready to start up on a production line. The present invention was developed so as to overcome such a problem where the improvement of the operating efficiency is impeded. It aims at providing a parameter generating device for a part mounting program, which automatically makes an optimum combination that can efficiently pick up parts to be placed.

SUMMARY OF THE INVENTION

A parameter generating device for a part mounting program as a first invention is configured so that a part table including at least a part type, a part quantity, a part supply method and a picking-up nozzle to be used is stored; combinations of parts to be picked up by a plurality of heads are generated based on the stored part table; an evaluation level of the operating efficiency when parts are picked up, based on each of the generated combinations, is given to each of the combinations; and a combination whose evaluation level is the highest is selected among the combinations; and the selected combination is registered.

A parameter generating method for a part mounting program as a second invention is a method for generating an optimum combination of parts to be simultaneously picked up, by using a programmed computer. It comprises the steps of storing a part table including at least a part type, a part quantity, a method for supplying parts and a picking-up nozzle to be used; generating combinations of parts to be picked up by a plurality of heads based on the table stored in the previous step; giving an evaluation level of operating efficiency when parts are picked up based on the combinations generated in the previous step, to each of the combinations; and selecting a combination whose evaluation level is the highest and registering the selected combination.

A storage medium as a third invention stores a program for running a parameter generating device for a part mounting program as described above.

Since the optimum pick up combination of parts is automatically determined based on a part table according to the present invention as described above, a user of the mounter need not search for a better combination among various combinations through trial and error, thereby improving the efficiency of the operations for making an arrangement starting from a switching operation of a part mounting line to a start-up operation of a new process line.

BRIEF DESCRIPTION OF THE DRAWINGS

FIG. 2 exemplifies a table (part table) indicating the attributes of parts to be placed on one board;

FIG. 5 is a schematic diagram showing search conditions for generating a combination indicated by a name (identifier) P11;

FIG. 8 is a schematic diagram 1 showing the search conditions for combinations of parts to be picked up by two heads, which are indicated by identifiers other than the identifier P11;

FIGS. 9A and 9B are schematic diagrams 2 and 3 showing the search conditions for combinations of parts to be picked up by two heads indicated by other identifiers;

FIGS. 10A, 10B, and 10C are schematic diagrams 4, 5, and 6 showing the search conditions for combinations or parts to be picked up by two heads, which are indicated by other identifiers;

FIGS. 11A, 11B, and 11C are schematic diagrams 7, 8 and 9 showing the search conditions for combinations of parts to be picked up by two heads, which are indicated by other identifiers;

FIG. 12 exemplifies an evaluation table of combinations of four parts to be picked up by two heads;

FIG. 14 is a schematic diagram showing three examples of search conditions for combinations of four parts to be picked up by two heads;

FIG. 15 is a schematic diagram showing four examples of search conditions for combinations of five parts to be picked up by two heads;

FIGS. 16A and 16B are schematic diagrams showing two examples of combinations which could possibly be adopted among combinations picked up by two heads depending on a case although their efficiency is low;

FIG. 19 is a schematic diagram showing four other examples of search conditions for combinations of three parts to be picked up by three heads;

FIGS. 20A and 20B are schematic diagrams showing five other examples of search conditions for combinations of three parts to be picked up by three heads;

FIGS. 21A and 21B are schematic diagrams showing four examples of search conditions for combinations of four parts to be picked up by three heads;

FIG. 22 is a schematic diagram showing two other examples of search conditions for combinations of four parts to be picked up by three heads;

FIG. 23 is a schematic diagram showing two other examples of search conditions for combinations of four parts to be picked up by three heads;

FIGS. 24A, 24B, and 24C are schematic diagrams showing three other examples of search conditions for combinations of four parts to be picked up by three heads;

FIG. 25 is a schematic diagram showing two examples of search conditions for combinations of five parts to be picked up by three heads;

FIG. 26 is a schematic diagram showing three other examples of search conditions for combinations of five parts to be picked up by three heads;

FIG. 27 is a schematic diagram showing two other examples of search conditions for combinations of five parts to be picked up by three heads;

FIGS. 30A, 30B and 30C are schematic diagrams showing five examples of combinations which could be possibly adopted among combinations to be picked up by three heads depending on a case although their efficiency is low.

DESCRIPTION OF THE PREFERRED EMBODIMENT

Figure 1:
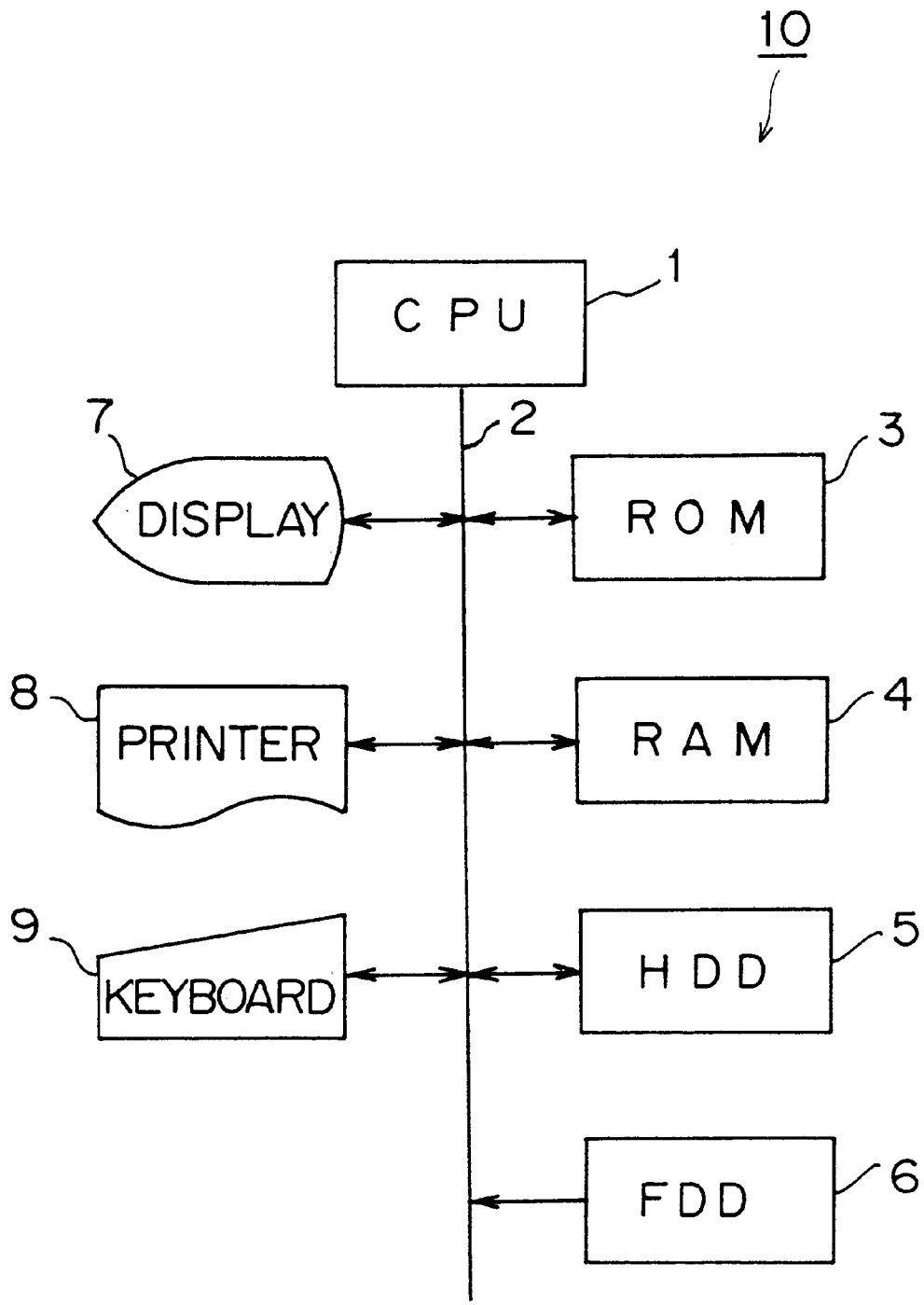
FIG. 1 is a block diagram showing the circuitry of a part mounting program generating device according to a first preferred embodiment.

Provided below is an explanation about a preferred embodiment according to the present invention, by referring to the drawings.

FIG. 1 is a block diagram showing the circuitry of a part mounting program generating device according to an embodiment. The part mounting program generating device comprises a CPU (Central Processing Unit) 1, a ROM (Read Only Memory) 3 connected to the CPU 1 via a bus 2, a RAM (Random Access Memory) 4, an HDD (Hard Disk Driver), an FDD (Floppy Disk Driver) 6, a display 7, a printer 8, a keyboard 9, etc.

The ROM 3 stores a control program of the part mounting program generating device. The CPU 1 controls the entire operation based on the above described control program.

The RAM 4 stores each type of data such as process data, device data, parts data etc.

The process data indicates combinations of mounters in a part mounting line. It is, for example, the data of three combinations of three devices composed of three mounters, that is, a combination of three As, a combination of two As and one B, and a combination of respective one A, B and C, each of which structures a part mounting line.

The device data is data of a mounting capacity of each of a plurality of mounters. It is, for example, data such as an average tact time, the structure of an operating head, the maximum size of an available board, the number of cassettes, a cassette pitch, a head pitch etc.

The parts data are data such as whether or not to enable each part to be mounted by each mounter, data composed of mounting conditions of each part when it is able to be placed, that is, additional codes indicating the size of a picking-up nozzle etc. Note that the above described parts data includes the number of parts to be placed for each part, which is read from design drawing data of a board.

The HDD 5 drives a hard disk. The hard disk stores each type of the above described data. The HDD 5 transfers the data to the RAM 4 according to the control of the CPU 1. Additionally, it temporarily stores a generated part mounting program, to be described later in detail onto the hard disk.

The FDD 6 drives a floppy disk. The floppy disk stores board data. The board data are data generated as one data unit for each board type. The board data respectively correspond to a plurality of part placing positions to be set on a board. It is composed of X coordinate data, "x" indicating the position of the X coordinate from the origin, Y coordinate data, "y" indicating the position of the Y coordinate from the origin, and data of each part type such as angle data α indicating a placing angle of a part, a part number indicating the type of the part, the size of the part, a part standard indicating the shape of the part etc. The above described part placing positions (data of X and Y coordinates) are directly input by a pointing device which is not shown in this figure and is connected to the keyboard 9 based on a design drawing of a board. The coordinate data input is implemented, for example, by displaying the design drawing on the screen of the display 7, and moving a cursor to the position at which the part is to be placed. As a result, the coordinate data at that position are input. The angle data and the data of each part type etc, are input as numeric values via the input keys of the keyboard 9. This board data is stored onto a floppy disk via the FDD 6, and immediately used or maintained.

The display 7 is intended to display each of the above described types of data of a design drawing or the data input via the input keys. It is implemented by, for example, a CRT display device or an LCD device, etc.

The printer 8 is intended to print and output the data stored in the RAM 4, or onto a hard disk or a floppy disk.

The CPU 1 reads one piece of process data, which is selected with an input among a plurality of pieces of set process data, from the RAM 4; recognizes a combination of mounters structuring a part mounting line based on the read process data; reads the device data of each mounter to be used for the part mounting line from the RAM 4; and reads the board data from the floppy disk via the FDD 6.

The above described process data, device data and board data are generated as base data in advance according to a manual input of data or an instruction for reading data. The CPU 1 distributes each part to each of the mounters structuring the part mounting line based on the read device data and the part data obtained from the board data so that the entire part placing time is the shortest. It then generates a part table, to be described later in detail, based on this distribution; stores the table in a working area in the RAM 4 (or onto a hard disk); performs an operation of a pick up combination of parts, to be described later in detail FIG. 2 is a table showing one example of an attribute table (part table) of parts to be placed on one board carried in a part mounting line, by one mounter. As shown in this figure, the part table is composed of a part type, a nozzle type, and whether or not to pick up is possible, a quantity, a supply type and a supply number.

The part type column indicates a type of a part, which is indicated by a part number. In the example shown in FIG. 2, the part numbers are represented by the symbols AAA to III. For ease of explanation, the example shown in FIG. 2 assumes that the nine part types AAA through III are placed on one board. Actually, however, part types more than those shown in FIG. 2 can be placed on one board. Normally, parts of 10 to 100 types (actually a part supply device which accommodates a number of parts) are arranged on a part rack of a mounter.

The nozzle type column indicates a type of a picking-up nozzle (simply referred to as a "nozzle" hereinafter) which can pick up the above described parts. Also the type of nozzle is indicated by a nozzle number. In the example shown in FIG. 2, the nozzle numbers are represented as P2, P7, P07, 31 and 32. Additionally, the same nozzle number appears side by side, for example, "P2, P2" in this figure. It indicates the arrangement of the nozzles when they are included in nozzle holders of the mounter. These nozzles are automatically replaced and picked up to heads depending on the type of a part to be placed a board.

Some of the columns in which the above described part numbers AAA, BBB etc., correspond to the nozzle numbers P2, P7, . . . are marked with circles. By way of example, the columns in which the part number AAA corresponds to the nozzle number P2 are marked with circles. They indicate that the nozzle numbered P2 (hereinafter referred to as a "nozzle P2", and also the other nozzles are referred to in a similar manner) can pick up the part numbered AAA (hereinafter referred to as a "part AAA", and also the other parts are referred to in a similar manner). Also the columns in which the part BBB corresponds to the nozzle P2 are marked with circles, and indicate that the nozzle P2 can pick up also the part BBB.

For the part DDD, the columns corresponding to both of the nozzles P2 and P7 are marked with circles. They indicate that the part DDD can be picked up by both of the nozzles P2 and P7. Similarly, the part FFF can be picked up by both of the nozzles P2 and P7. The part III can be picked up by both of the nozzles P2 and P7. The part EEE can be picked up by only the nozzle P7, and the part GGG can be picked up by only the nozzle 31.

The quantity column indicates the number of parts to be placed on one board. In the example shown in FIG. 2, the numeric value "6" appears in the quantity column of the part AAA. This indicates that six part AAAs are placed on a board to be processed by the mounter. Similarly, four part BBBs, three part CCCs, two part DDDs, two part EEEs, two part FFFs, two part GGGs, one part HHH, and one part III are placed on the board.

The supply type column indicates the type of a device which supplies a part. "8 mm" indicates that the type of the supply device is a part cassette. The width of the part accommodating tape in this case is 8 mm. Similarly, "16 mm" indicates that the type of the supply device is also a part cassette. It indicates that the width of the part accommodating tape is 16 mm. Also "12 mm", "24 mm", etc. are similar. Note that if the supply device is a part tray or a part stick, it is represented by acronymic character data such as "TR" and "ST".

The supply number column indicates the number of an equipment position of a supply device on a part supply board. "0" indicates that there is no restriction on the equipment position. An integer equal to or larger than "1" indicates that the equipment position of the supply device on the part supply board is designated by the user of the mounter. Since each supply number column of each of the parts is "0" in the example shown in FIG. 2, the supply devices of the parts AAA through III may be placed on arbitrary positions on the mounter.

The CPU 1 of the part mounting program generating device assumes that nozzles selected according to parts to be placed on a board are installed to a plurality of heads, and determines a combination of parts so as to optimally pick up the parts which can be picked up at one time (at the same time by the plurality of heads, or by a head moving minimally in the direction of the X axis) in the shortest time, based on the above described part table by performing a move not in the direction of the Y axis, but only in the direction of the X axis, on the condition that the nozzles are not replaced partway.

This combination determination process is intended to finally determine an efficient procedure for picking up all parts by repeating the process with which possible pick up combinations, depending on the number of heads and a nozzle type, are automatically searched based on a part table; evaluations are made depending on the duration of the pick up process time; a combination to which the highest evaluation level is given is extracted; parts and quantities corresponding to the extracted combination are removed from the part list; and combinations are again searched based on a new part table composed of the remaining parts (parts which are not extracted). Provided below is an explanation about the algorithm of these operations.

Figure 3:
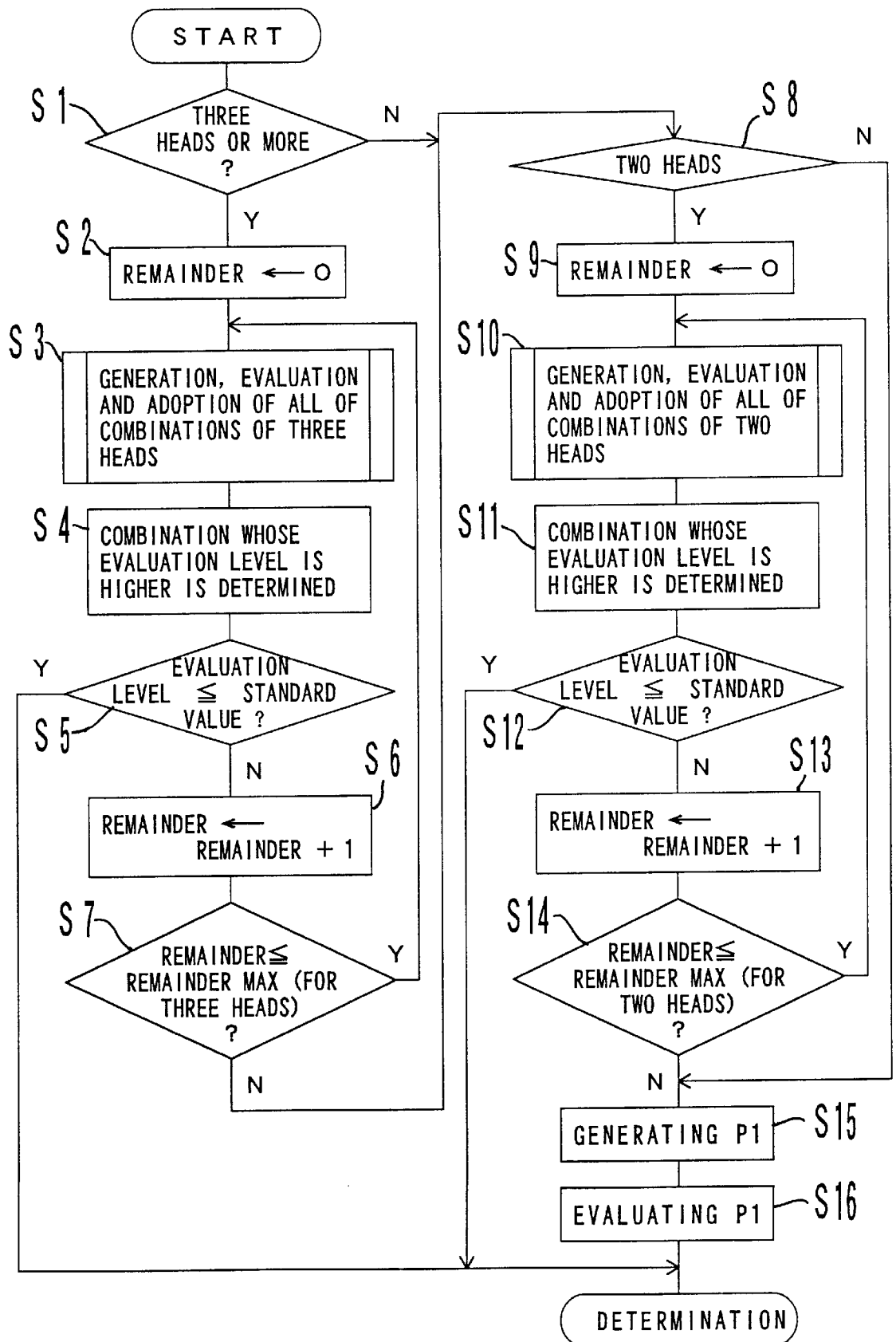
FIG. 3 is a main flowchart showing a process for determining an optimum pick up combination of parts, which is performed by a CPU.
Figures 4A, 4B:
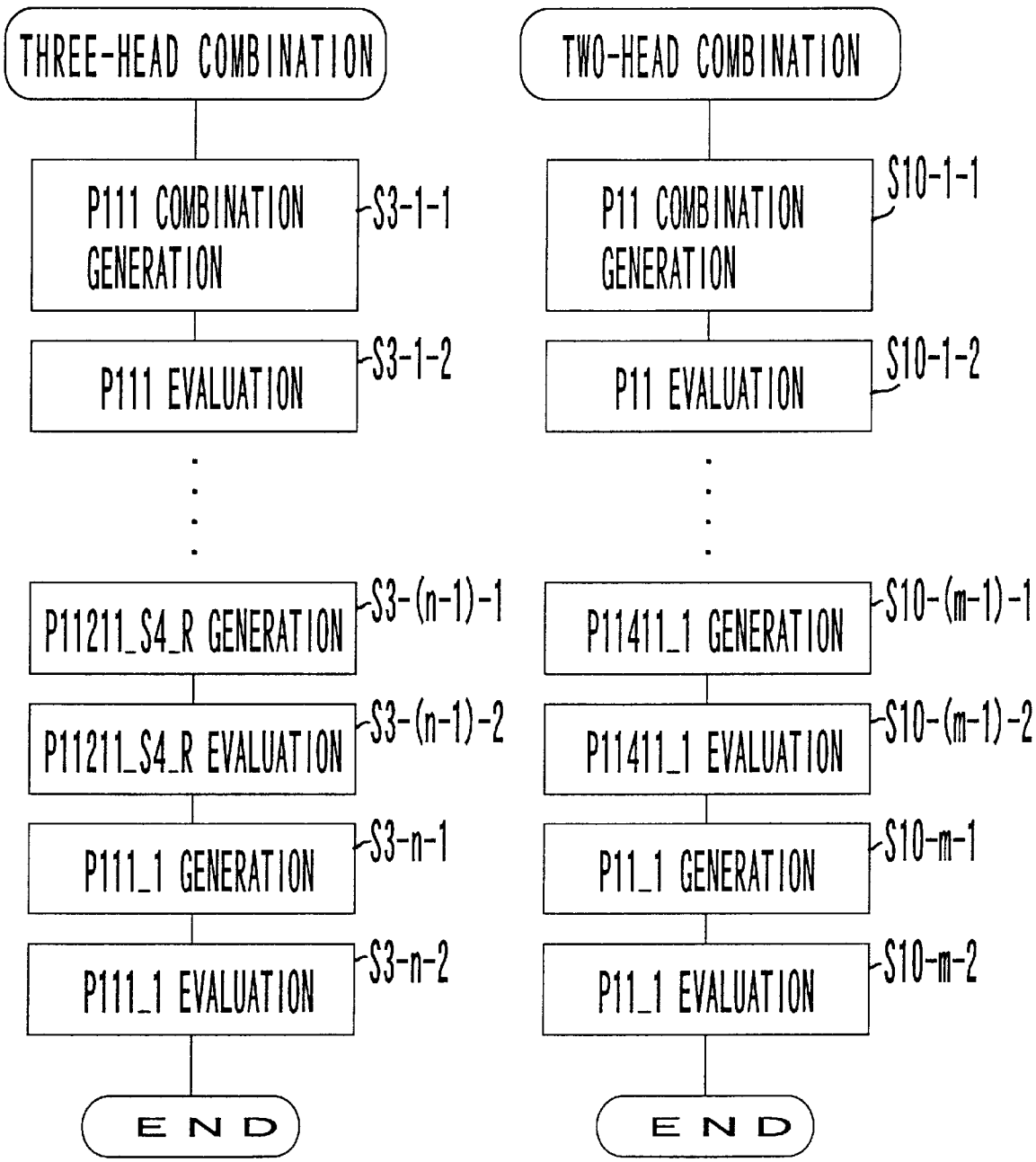
FIG. 4A is a flowchart further explaining the process performed in step S3 of the main flowchart.
FIG. 4B is a flowchart further explaining the process performed in step S10 of the main flowchart.

FIG. 3 is a main flowchart showing the process for determining an optimum combination of parts, which is performed by the CPU 1. FIG. 4A is a flowchart for further explaining the details of the process performed in step S3 of the main flowchart, while FIG. 4B is a flowchart for further explaining the details of the process performed in step S10 of the main flowchart. Note that one of the CPU internal registers is used as a remainder register with this process.

According to the flowchart shown in FIG. 3, it is first determined whether or not the number of heads is three or more (step S1). This process determines the number of heads of mounters, and at the same time, it determines from which number of heads picking up parts must be evaluated, so as to determine whether or not each pick up combination is suitable (hereinafter referred to as "evaluate").

This preferred embodiment assumes the case in which mounters respectively having three heads and mounters respectively having two heads (for example, three devices in total) are arranged and operated side by side. Accordingly, it is first determined whether or not the number of heads is three.

If a mounter has two heads, it is meaningless to evaluate a combination of parts to be picked up by three heads. Therefore, the result of the determination performed in step S1 is "NO" (N) in this case, and the process immediately goes to step S8. Additionally, in this preferred embodiment, after the process for evaluating all combinations of parts to be picked up by three heads (that is, all combinations which are worth being evaluated; actually, a combination whose evaluation is not proved to be high is excluded in advance) is completed, the process for evaluating combinations of parts to be picked up by two heads (one of the three heads is halted) is then performed. Accordingly, also when the evaluations of all of the combinations of parts to be picked up by three heads are completed, the process goes to step S8. For ease of explanation, the process in and after S8 will be explained first.

In step S8, it is determined whether or not a pick up combination, which is provided as a procedure, is 2 heads. If "YES" ("Y" in step S8), "0" is initially set to the remainder register (step S9). The number of times that parts overflowing in a certain pick up state implemented by a plurality of heads (an allowable number of an overflow) is set to the remainder register. Initially (at the initial setting), "0" is set to the remainder register as described above so as to start the evaluation of the combination with the highest efficiency, which allows all parts whose number is predetermined to be picked up when the parts are picked up by a plurality of heads (two heads in this case). Then, two-head combinations, which do not leave a remainder, are sequentially generated under the conditions to be described later, and evaluated. Then, a combination to be adopted is determined based on the evaluations (step S10).

The process performed in step S10 is further explained by using the flowchart shown in FIG. 4B. As shown in this figure, the process for two-head combinations performed in step S10 includes a process for generating a combination named P11, which is the combination with the highest efficiency of pick up (step S10-1-1), a process for evaluating the combinations (step S10-1-2), a process for generating other two-head combinations, and a process for evaluating the combinations (indicated by the dotted line in this figure). As the second process from the last for the two-head combinations, the process for generating a combination named "P11411_1", which is a combination with low efficiency of pick up among the two-head combinations (step S10-(m-1)-1), and a process for evaluating that combination (step S10-(m-1)-2) are performed. Lastly, a process for generating a combination named "P11_1", which is a combination with the lowest efficiency of pick up (step S10-m-1), and a process for evaluating that combination (step S10-m-2), are performed.

FIG. 5 is a table showing various conditions for generating a combination named "P11" in the above described step S10-1-1. This table is stored in the RAM 4 as a table for two heads beforehand. The operating condition of this combination named "P11" is that two heads (can) simultaneously pick up two parts (parts of two part types) as shown in the first column of the table of FIG. 5.

As shown in the second column, the name of this combination "P11" is one of identifiers of combinations that the CPU 1 sequentially generates under predetermined conditions within a part mounting program generating device. "(2)" immediately after the identifier P11 is appended for ease of explanation, and indicates the number of types of parts to be combined as the combination P11. Note that the CPU 1 can recognize this combination as a combination composed of two part types according to only the identifier P11.

The third column of the table visually represents the pick up state of parts of the combination P11, that is, the operating condition in the first column. Symbols "A" and "B" represent a part type and a quantity. Assuming that the symbol "A" represents the part AAA, this symbol represents both the part type "AAA" and its quantity "6" (refer to FIG. 2). Or, assuming that symbol A represents the part "BBB", this symbol represents both the part type "BBB" and its quantity "4". Also symbols C, D, E, F etc., which will appear later, are similar. The circles shown in this figure represent nozzles picking up the above described parts. "•••" represents that the nozzles of adjacent heads can simultaneously pick up parts. Accordingly, "0•••0" represents that the nozzles of two heads can pick up parts of two types represented by the symbols A and B. Parts assigned to these symbols are determined based on a quantity condition of the parts, which appears in the succeeding column, and a pick up condition indicating the relationship of nozzles, which appears at the bottom of the table.

For the title "P11" which appears in this figure, the quantity condition of parts to be combined is "A=B+ remainder". Here, the "remainder" is a number indicated by a numeric value assigned to the remainder register, and its initial value is "0". That is, "A=B". Although the details will be described later, combinations are examined based on the assumption that the remainder is "0". If a combination whose evaluation is high cannot be obtained, the process in step S10 is again performed by assuming that the remainder is "1". That is, the process for searching for the combination entitled "P11" in step S10-m-1 is resumed on the condition that the remainder is "1". The quantity condition is "A=B+ 1" at this time. Hereinafter, also the quantity condition including "+remainder" for other combinations is similar.

If the remainder is "0" at the initial setting, then "A=B" as described above. That is, the quantities of parts of two types are the same. The CPU 1 searches for parts which satisfy the above described quantity condition "A=B" by examining all combinations generated by combining two part types from 9 part types, based on the part table shown in FIG. 2. The CPU 1 simultaneously references also the pick up condition at this time. The pick up condition for this combination P11 is that A and B are (can be) absorbed by different nozzles. Here, the "different nozzles" mean nozzles picked up to respective heads, and do not mean nozzle types. As shown in FIG. 2, one nozzle holder often contains two nozzles of the same type such as P2, P2, and P7, P7 as shown in FIG. 2. If the nozzle holder contains two nozzles of the same type, a nozzle of the same type such as the nozzle P2 can be respectively picked up to respective heads, for example, heads numbered 1 and 2. Also the P2 nozzles which have been picked up to the heads numbered 1 and 2 in this case are defined to be different nozzles.

Under such conditions, the CPU 1 examines all combinations composed of two parts among 9 parts, and searches for parts which satisfy the above described quantity condition "A=B", based on the part table shown in FIG. 2. The parts which satisfy the quantity condition "A=B" are proved to be the parts DDD, EEE, FFF and GGG based on the part table shown in FIG. 2. The CPU 1 then searches for a combination of two types to be combined depending on the pick up condition among these four part types, and evaluates the combination.

Note that the operating condition among the above described conditions is automatically determined according to the quantity condition and the pick up condition. Accordingly, it is not supplied to the CPU 1 as data, and is included for ease of understanding as is the pick up state illustration. To the CPU1, an identifier, the quantity condition and the pick up condition are provided from the table which was generated beforehand and stored in the RAM 4.

Figure 6:
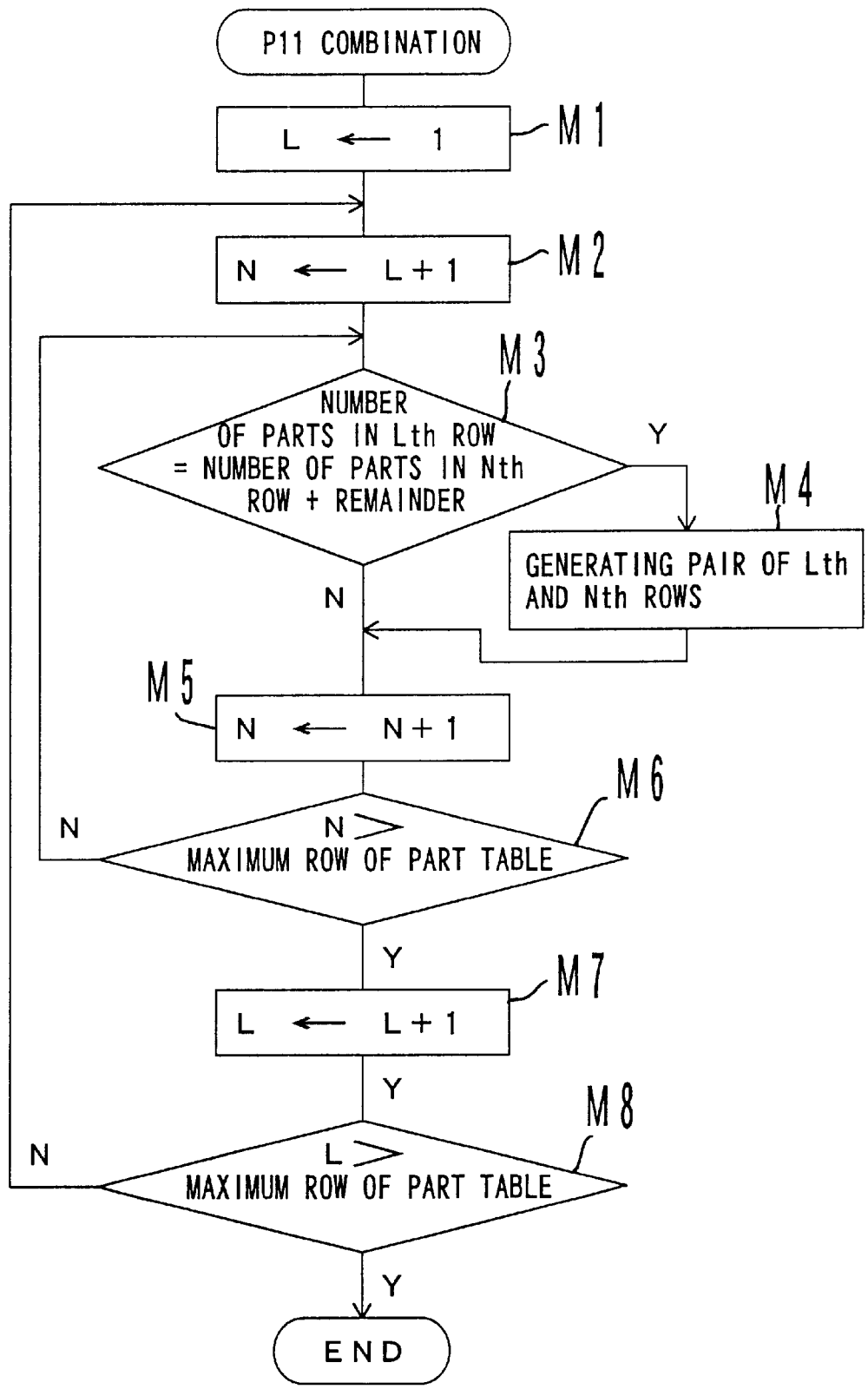
FIG. 6 is a flowchart showing the process for searching for the combination indicated by the identifier P11 based on its search conditions and part table.

FIG. 6 is a flowchart showing the algorithm for searching for a combination of two part types which satisfy the quantity condition "A=B" and the pick up condition among nine parts based on a part table. With this process, the CPU 1 uses a plurality of its internal registers as registers L and N. Or, the CPU 1 allocates register areas L and N in a working area of the RAM 4. The registers L and N respectively represent the rows of the part table shown in FIG. 2.

In FIG. 6, "1" is initially assigned to the register L (step M1). With this operation, the part AAA in the first row of the part table shown in FIG. 2 is specified as the first part to be searched for a combination. Then, the value obtained by adding "1" to the value of the register L is assigned to the register N (step M2). With this operation, the part BBB in the next row is first examined as a part to be combined with the specified AAA.

That is, it is determined whether or not the number of parts (the quantity of the part AAA "6") in an Lth row (the first row in this case) is equal to the value obtained by adding the remainder ("0" in this case) to the number of parts (the quantity of part BBB "4") in an Nth row (the second row in this case) (step M3). If "NO" ("N" in step M3), this combination does not satisfy the given condition. In this case, "1" is added to the value of the register N so as to examine a combination with the part in the next row (M5). Then, it is determined whether or not the row exceeds the last row of the part table (step M6). If "NO" ("N" in step M6), the process goes back to step M3. The process of steps M3 through M6 is then repeated.

In this way, the part AAA at the top of the part table is used as a basis, and the parts BBB through III in the subsequent rows are sequentially searched as a part to be combined with the part AAA. Then, it is determined whether or not it is possible to generate a combination.

Since the part table does not include a part to be combined with the part AAA in this case (the combination numbered P11), the result of the determination made in step M3 is "N" until the completion of the examination of the part III. Accordingly, a next row is determined to have exceeded the last row of the part table in step M6 ("Y" in step M6). Then, "1" is added to the value of the register L (step M7). With this operation, the part BBB in the row next to the part AAA is specified as a basis of the combination search.

The process then goes back to step M2 after the part BBB is not determined to have exceeded the last row of the part table (the result of the determination made in step M8 is "N") also in this case. The process of steps M2 through M6 is then repeated. In this way, the parts CCC through III in the subsequent rows are sequentially searched as a part to be combined with the part BBB by recognizing the part BBB as a basis, and it is determined whether or not it is possible to generate a combination.

Thereafter, the process of steps M3 through M6 is repeated, and it is determined that the part table does not include the part to be combined with the part BBB. Then, the next part CCC is recognized as a basis in steps M7 and M8. The subsequent part DDD is specified as an examination target in step M2, and it is repeatedly determined whether or not it is possible to generate each of the combinations with the parts DDD through III to be targeted in steps M3 through M6.

In this way, when the part DDD is recognized as a basis (the number of the parts is "2"), the next part EEE (the number of the parts is "2") is determined to satisfy the quantity condition (the first condition that the result of the determination in step M3 is "Y"). In this case, the part DDD is assigned to the symbol A, and the part EEE is assigned to the symbol B (see FIG. 5). As a result of further examination of the pick up condition, the nozzle types which can absorb the part DDD are P2 and P7. First of all, the part DDD (symbol A) is assigned to the nozzle P2 (for example, the nozzle P2 is equipped on the head numbered 1). The nozzle which can pick up the part EEE is only P7. The part EEE (symbol B) is therefore assigned to the nozzle P7 (that is, the nozzle P7 is placed on the head numbered 2). Consequently, the pick up condition that A and B are (can be) picked up by different nozzles is satisfied. Note that the nozzle P7 can also pick up the part DDD for this combination. Because the nozzle holder contains two P7 nozzles as is known from the part table, the above described pick up condition that A and B are picked up by different nozzles can be satisfied by picking up the nozzle P7 to the heads numbered 1 and 2.

As described above, the pick up condition is also determined to be satisfied (the second condition that the result of the determination in M3 is "Y"), the combination of the Lth row (part DDD in this case) and the Nth row (part EEE in this case) is extracted, and the extracted combination of the parts DDD and EEE is written to a combination column of an evaluation table arranged in a predetermined area in the RAM 4 (step M4)

With this process, the combination of the parts DDD and EEE is generated as one of pick up combinations represented by the identifier P11. Since the respective numbers of the parts DDD and EEE of this combination are "2", all of them can be picked up by two heads twice, and no remainder is left.

Succeeding the generation of this combination generation, the parts in and after the "L+1"th row, that is, the parts subsequent to the part EEE with which a combination is generated, are sequentially searched and examined.

As a result, combinations of parts of two types which can be simultaneously picked up by respective heads, and whose numbers are the same, are sequentially extracted from a part table. That is, from the part table shown in FIG. 2, six combinations composed of two types among the four part types DDD, EEE, FFF and GGG are generated in the part combination column of the evaluation table.

Figure 7:
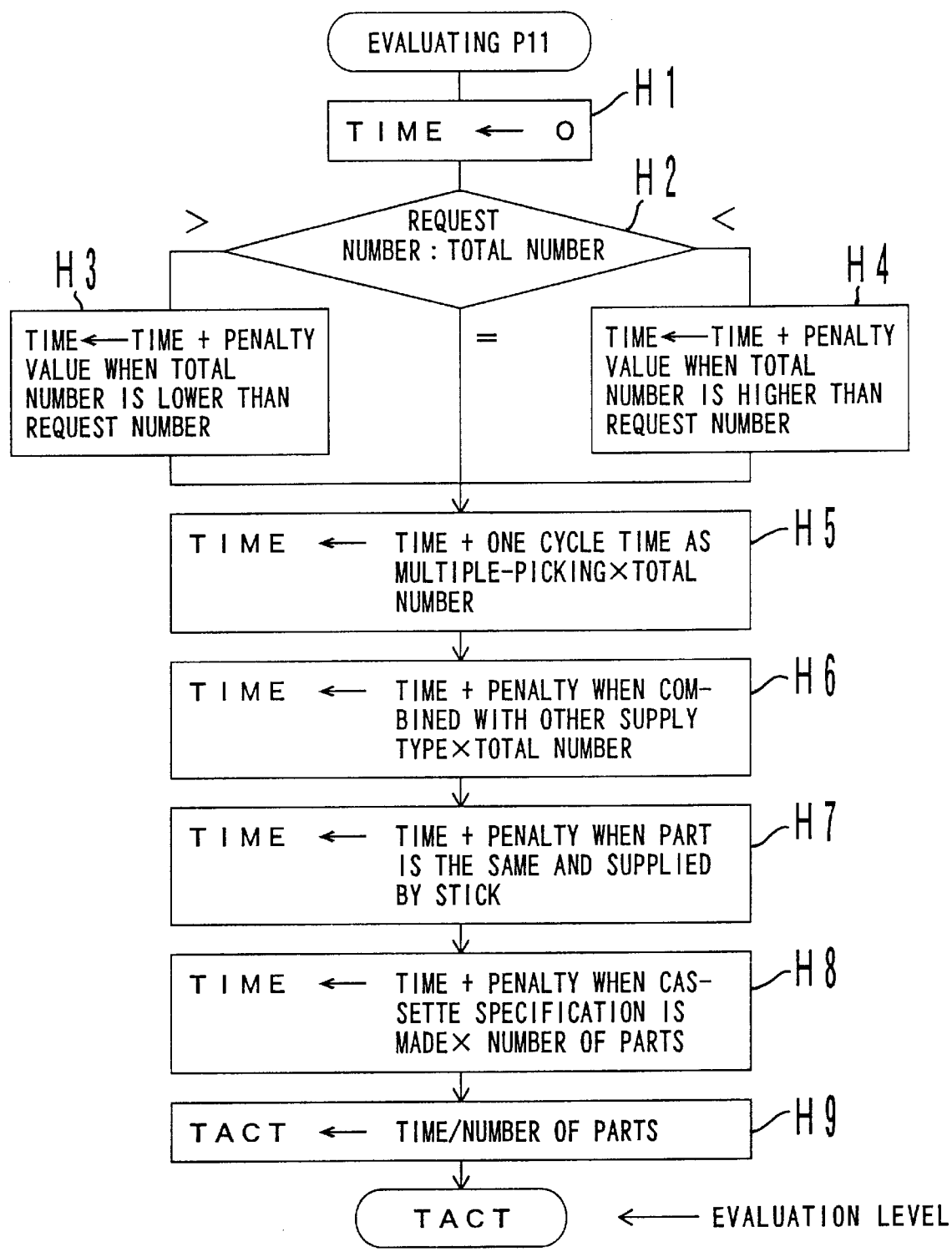
FIG. 7 is a flowchart showing the process for evaluating the searched combination indicated by the identifier P11.

FIG. 7 is a flowchart showing the algorithm for calculating an evaluation level given to each combination generated as described above in the evaluation table. Note that a time register area is arranged in the RAM 4 with this process. The time register is intended not to measure a time, but to preset a value corresponding to the time delay of pick up operations, which is experimentally proved depending on a combination state as a penalty. That is, the time register is intended to preset a penalty value which can be calculated as an empirical rule, and to accumulate this value for each combination.

Namely, the evaluation made in this preferred embodiment is based on a disadvantage accumulation method. Accordingly, the larger the value accumulated in the time register, the lower the evaluation level. In other words, the smaller the accumulated value, the higher the evaluation level. For the evaluation table, an example of its evaluation result will be explained by using other combinations which will be described later (identifier P1221), and are shown in other drawings. Provided here is the explanation about only the evaluation algorithm by referring to the flowchart. This process is performed for each row starting from the top of the evaluation table (FIG. 12 shows one example of this table). The flowchart shown in FIG. 7 shows the evaluation process performed for a combination in one row.

In FIG. 7, "0" is initially set to the time register (step H1). A comparison between a request number and a total number is then made (step H2). Here, the request number is the number of parts, which is an optimum number of parts to be placed by the mounter, that is, the number of parts desired to be placed by the mounter in consideration of the capability of the process line, while the total number is a total number of parts which can be actually picked up by a combination searched by the process shown in FIG. 6.

If the "request number" equals the "total number" as a result of the determination made in step H2, the number of parts to be placed and the total number of parts which can be actually picked up are the same. Therefore, no penalty is imposed and the process immediately goes to step H5. If the request number is lager than the total number in step H2, a penalty value which is predetermined for the case in which the total number is smaller than the request number, is added to the value of the time register (step H3). The process then goes to step H5. If the request number is smaller than the total number, the operation efficiency is empirically proved to deteriorate. Accordingly, also in this case, a penalty value which is predetermined for a case in which the total number exceeds the request number, is added to the value of the time register (step H4). The process then goes to step H5.

Next, the value obtained by multiplying the total number by one cycle time as multiple-picking (simultaneous pick up of parts by a plurality of heads), is added to the value of the time register (step H5). One cycle time is defined as "1" at the time of the simultaneous pick up such as the pick up of the identifier P11. In the meantime, it is defined as "2" at the time of the pick up by a head moving in the direction of the X axis, such as the pick up of the identifier P11-1 etc. Because "1" and "2" are evaluation levels, they may be arbitrary values. That is, it is allowable that the value at the time of the simultaneous pick up is smaller than the value at the time of the one-by one pick up.

Following the above described process, it is determined whether or not this combination is combined with another supply type. If "YES", the value obtained by multiplying its penalty value (larger than "1") by the total number is added to the value of the time register (step H6). The "combination with another supply type" indicates the case in which the types of supply devices are different. If both of the combined parts DDD and EEE are supplied by an 8-mm-width cassette supply device, no penalty is imposed. This is because the types of the supply devices are the same. (However, the penalty value "1" is assigned because the multiplication is performed). If both of the parts are supplied by an 8-mm-width cassette supply device and a 12-mm-width cassette supply device or an 8-mm-width supply cassette device and a supply tray device, it means a combination with a supply device of a different type. If supply devices are different as described above, speeds at which the parts are supplied are different. Therefore, even if there is no move in the direction of the X axis, either of the heads must wait for pick up of a part. Accordingly, a penalty value larger than "1" is set. This penalty value is added to the value of the time register.

Then, it is determined whether or not either of the parts is supplied by a stick supply device. If "YES", a penalty value is added to the value of the time register (step H7). Since the stick supply device is intended to supply a part by vibrating and dropping it from a supply part, a delay always occurs in a supply time and a pick up wait occurs on the side of the head if either of the parts is supplied by a stick supply device. As a result, a pick up wait occurs on a head side. The penalty is therefore set and added to the time register.

If there is a part to which cassette specification is made in this combination, the value obtained by multiplying the penalty value (larger than "1") by the number of parts is added to the time register (step H8). The cassette specification is represented by a supply number other than "0" in the part table shown in FIG. 2. When the arrangement position of the supply cassette is specified as described above, the degree of arbitrariness of the combination may sometimes be lowered. Therefore, the penalty is imposed. If no cassette specification is made, "1" is assigned as the penalty value also in this case.

Lastly, a total evaluation level (penalty total value) accumulated in the time register is divided by the total number, and its result is stored in a tact register (step H9). The value stored in the tact register is the evaluation level.

After the combination indicated by the identifier P11 is generated and evaluated as described above (after step S10-1-2 of FIG. 4B), other combinations of parts to be picked up by two heads with the remainder "0" are sequentially generated and evaluated.

FIGS. 8 through 13 are schematic diagrams showing the conditions for searching for other pick up combinations using two heads. Each of the figures shows an operating condition, an identifier, a pick up state illustration, a quantity condition and a pick up condition. The process for searching for these combinations is performed between the above described process performed in step S10-1-2, and step S10-(m-1)-1. With this process, a combination whose efficiency was proved to be low beforehand is excluded from the search process without providing a condition from scratch. In this way, a waste of combination search time can be prevented.

Provided first is an explanation about the conditions shown in FIG. 8. The operating condition is that two parts can be (simultaneously) picked up by two heads, and a remaining (part) A (which is not simultaneously picked up) can be picked up (by means of a moving support for supporting two heads which moves in the direction of the X axis). The number of the combinations to be searched under this condition is 2, and their identifiers re "P121_1" and "P211_1".

Double circles appearing in the pick up state illustration indicate parts to be picked up by two heads by move in the direction of the X axis. Furthermore, the pick up state illustrations of the combination of the identifiers P121_1 and P211_1 are mutually symmetrical. They are symmetrically represented as a different combination if the nozzle conditions (pickable parts) for the two heads are not the same even if the types and the numbers of parts of a combination are the same, so as to be able to cope with the type of the mounter which has two heads, no nozzle holder, and nozzles cannot be replaced during the operations. Also, the other pick up combinations using two heads or three heads, which will be described later, are similar.

The quantity condition "(A−B/2>0" is basically equivalent to "A>B". "The remainder of 2 of (A−B) is 0" is equivalent to "(A−B) is an even number". Furthermore, the following pick up conditions are specified under the quantity condition.

"B and A are (can be) picked up by different nozzles";

"(two) As are (can be) picked up by different nozzles"; and

"A and B are (can be) picked up (also) by the same nozzle".

As described above, "B and A are picked up by different nozzles" indicates the condition that a nozzle which can pick up B can be installed to the head numbered 1, and a nozzle which can pick up A can be installed to the head numbered 2 (based on a part table). "Two As are picked up by different nozzles" indicates the condition that both of the above described nozzles installed to the heads numbered 1 and 2 can pick up the two As. "A and B are picked up by the same nozzle" indicates the condition that the head picked up B with the pick up process can lastly pick up also A using two heads.

In this case, there is no restriction on the number of times that "○ ••• ◎" are simultaneously picked up. Additionally, there is no restriction on the number of times that the individual pick up of "◎◎" is repeated. For each of these combinations "P121_1" and "P211_1", an evaluation table is generated, and a combination of parts corresponding to each of the combinations is written to a combination column, and its evaluation is made.

Furthermore, since the remainder "0" is specified to the quantity condition for these two combinations 2P112_1" and "P211_1", they are processed in step S10 of the initial process cycle in which "0" is assigned to the remainder register in step S9 of FIG. 3 according to the flowchart shown in FIG. 4B, and are excluded as untargeted combinations in step S10 of the process cycle in which "1" is assigned to the remainder register, which is repeated later.

FIG. 9A shows the search conditions for a combination which can simultaneously pick up three parts using two heads. This combination is that with the highest efficiency when the three parts are picked up by the two heads. Its quantity conditions are "(A−B)−C+remainder" and "A>B>C". They mean that the number obtained by subtracting the number of Bs from the number of As represented by the symbol A (hereinafter referred to as a part A; also the other symbols B, C, etc. are similar) is equal to the number of Cs (the remainder is "0") or the remainder is left, and the number of As is larger than the number of Bs, and at the same time, the number of Bs is larger than the number of Cs. The pick up state illustration shows that part B and part A can be simultaneously picked up once or a plural number of times, and the part A and the part C can be simultaneously picked up once or a plural number of times. The pick up conditions for this combination represented by (the identifier) P121 are that "B and A are picked up by different nozzles", "A and C are picked up by different nozzles", and "B and A are picked up by the same nozzle", and "A and C are picked up by the same nozzle". Since these meanings are similar to those explained by referring to FIG. 8, the explanations are omitted here. Additionally, the pick up conditions for other combinations are shown in the drawings, but their explanations are omitted.

FIG. 9B shows the search conditions for a combination of three parts, two of which can be picked up by two heads, and one pair cannot be simultaneously picked up (picked up by the two moving heads). Its identifier is P211, and its quantity condition is "(A−B)=C+remainder". The parts A and B in the pick up state illustration is "○ ••• ○" and they can be simultaneously picked up at one time or a plural number of times. "•••" does not exist between the parts A and C, that is, "○" and "○". It indicates a combination which cannot be picked up simultaneously. This combination can be picked up by the moving support which moves in the direction of the X axis, once or a plural number of times.

For the combinations shown in FIGS. 9A and 9B, "+remainder" is included in each right side of each expression indicating the quantity condition. According to this preferred embodiment, the remainder may be up to "1", and the allowed value of the "+remainder" included in each right side of each expression is "0" or "1". Accordingly, the process for searching for these combinations represented by P121 and P211 is performed both in step S10 of the initial process cycle in which "0" is assigned to the remainder register in step S9 of FIG. 3, and in step S10 of the process cycle repeated later, and in which "1" is assigned to the remainder register.

FIGS. 10A, 10B and 10C show the search conditions for other combinations of three parts to be picked up by two heads. Their identifiers are respectively P1221_1, P1311_1 and P3111_1. Because the contents (meanings) of their operating conditions pick up state illustrations, quantity conditions, and pick up conditions are the same as those explained earlier in this specification, only their drawings are exhibited. Their explanations, however, are omitted here.

FIGS. 11A, 11B and 11C show three examples of the conditions for searching for combinations of four parts to be picked up by two heads. Their identifiers are respectively P1221, P1331 and P3111.

Although the contents (meanings) of their operating conditions, pick up state illustrations, quantity conditions and pick up conditions are the same as those explained earlier in this specification, the method for generating an evaluation table will be described by again explaining FIG. 11A.

FIG. 12 shows an example of the evaluation table of combinations of four parts to be picked up by two heads. The format of the evaluation table is predetermined. Each combination represented by one identifier is written to a predetermined area in the RAM 4, and a combination search based on a part table and search conditions is written to a part combination column of the evaluation table. The evaluation table shown in this figure includes the columns such as No., combination of parts, total number, request evaluation, simultaneous pick up evaluation, same supply evaluation, overall evaluation and an evaluation level. A plurality of other columns (columns corresponding to, for example, parts to be supplied by a stick or a tray) are arranged between the same supply evaluation column and the overall evaluation column. Since these columns shown in this example are empty (blank columns), they are omitted from this figure.

The CPU 1 sequentially searches for the combinations, for example, represented by the identifiers shown in FIGS. 8 through 10, writes the searched combinations to the evaluation table for each of the identifiers, evaluates them, reads the search conditions for the combination represented by the identifier P1221 shown in FIG. 11 from a predetermined area in the RAM 4, and starts searching for this combination in the process after step S10-1-2 of and before step S10-(m-1)-1 in FIG. 4B, that is, the detailed process of step S10 of FIG. 3.

The identifier P1221 represents a combination of "four parts which are (can be) (simultaneously) picked up by two heads" as shown in the operating condition of FIG. 11A. The four parts (parts of four types) are represented by the symbols A, B, C and D as shown in the pick up state illustration. Their numbers included in the part table must satisfy the quantity conditions "(A−B)<C" and "(C−(A−B))=D+remainder" and "A>B>C>D". Additionally, as indicated by the pick up conditions, a nozzle holder must contain the nozzles which are installed in respective heads, and can simultaneously pick up the parts A and B according to the pick up conditions; the respective heads installed with the nozzles are required to be able to pick up the parts A and C simultaneously, and these heads are required to be able to pick up also the parts C and D simultaneously; the nozzle installed in the head numbered 1 (the nozzle of the same head) is required to be able to pick up the parts B, A and C; and the nozzle installed with the second head (the nozzle of the same head) is required to be able to pick up the parts A, C and D.

According to a procedure similar to that shown in FIG. 6, the CPU 1 first reads out the first row of the part table and assigns the part AAA to the part A as a basis part, and reads out the second row and assigns the part BBB to the part B, so as to generate "(A−B)". According to the part table, "A−B=2". Next, the CPU 1 reads out the third row and assigns the part CCC to the part C, and determines whether or not the initial quantity condition "(A−B)<C" is satisfied. If "NO", the CPU 1 will assign the part DDD in the fourth row to the part C, and determine whether or not "(A−B)<C" is satisfied. Because "(A−B)<C", that is, "2<3" in the third row and the condition is satisfied in this case, the CPU 1 immediately reads out the fourth row and assigns the part DDD to the part D. Then, it determines whether or not the second quantity condition "(C−(A−B)=D+remainder" is satisfied.

Since this is the case in which "0" is assigned to the remainder register in step S9 of FIG. 3, the above described condition is equivalent to "(C−(A−B))=D". If the parts AAA, BBB, CCC and DDD assigned to the parts A, B, C and D are applied to this condition, it will be "(3−(6−4))=2" according to the part table and the condition is not satisfied. Therefore, the CPU 1 excludes this combination, reads out the next row and assigns the part EEE to the part D, and again determines whether or not "(C−(A−B))=D" is satisfied. It repeatedly performs this process for the parts FFF and GGG. Because "(C−(A−B))=D" is satisfied when the CPU 1 reads out the part HHH and assigns it to the part D, the CPU 1 determines whether or not the last quantity condition "A>B>C>D" is satisfied in this case. If the parts AAA, BBB, CCC and HHH assigned to the part A, B, C and D are applied to this condition, it will be "6>4>3>1" according to the part table and this condition is satisfied. Accordingly, the parts AAA, BBB, CCC and HHH of this combination are written to the evaluation column (the first row) of the evaluation table as shown in FIG. 12.

Since the part HHH is not the last row of the part table, the CPU 1 reads out the next row (that is, the last row in this case), assigns the part III to the part D, and determines whether or not the quantity conditions "(C−(A−B))=D" and "A>B>C>D" are satisfied. They will be "(3−(6−4))=1" and "6>4>3>1", that is, the conditions are satisfied also in this case. Therefore, the CPU 1 writes these parts to the evaluation column (second row) of the evaluation table shown in FIG. 12.

Next, the CPU 1 repeats the above described condition determination process in which it assigns the part BBB in the second row of FIG. 2 to the part A as a basis, and assigns the part CCC in the third row to the part B. As a result, eight combinations numbered 1 through 8 are written to the "part combination" columns of the evaluation table as all of the combinations represented by the identifier P1221, as shown in FIG. 12.

Although the combination of the parts BBB, GGG, FFF and III satisfies the quantity conditions, the pick up conditions are not satisfied. Therefore, this combination is excluded. As described above, the CPU 1 determines whether or not the pick up conditions are satisfied while determining the quantity conditions, and writes combinations which satisfy all of the conditions to the evaluation table.

As described above, the complicated and troublesome operations must be performed so as to search for all combinations which satisfy search conditions only for a combination represented by the identifier P1221. Since there are actually many other combinations whose search conditions are different and all of the combinations are searched, it is almost impossible to perform this search process manually. Additionally, since the actual number of part types is 10–100, the manual search becomes more difficult. Furthermore, whether or not searched combinations are suitable must be determined. Therefore, the difficulty in the manual search increases.

According to this preferred embodiment, a combination which is searched and written to an evaluation table is evaluated for each evaluation table in a similar manner to the process in FIG. 7. This evaluation process is further explained by referring to FIG. 12, based on the assumption that the request number is "20".

First of all, the evaluation is sequentially made from the first row (the combination numbered 1) of the evaluation table of FIG. 12. This combination is composed of the parts AAA, BBB, CCC and HHH. The total number of this combination "14" is obtained from "6+4+3+1" according to the part table shown in FIG. 2. The request evaluation is an absolute value of the difference between the total number and the request number when the former is smaller (or larger) than the latter. Accordingly, the request evaluation at this time is "6" resulting from "20−14".

In the next "simultaneous pick up evaluation" column, simultaneous pick up is the search condition for all of the combinations represented by the identifier P1221. Accordingly, the penalty value is set to "1". This penalty value is multiplied by the total number "14", so that the simultaneous pick up evaluation "14" is obtained. When the simultaneous pick up cannot be performed (cannot be picked up without a move of heads in the direction of the X axis), the penalty value is set to "2". Or, the penalty value is set to a decimal number which is larger than "1", for example, "1.5". The value resulting from the multiplication by the total number may be rounded in this case.

The "same supply evaluation" column indicates whether or not the types of supply devices are the same. If they are different, their supply speeds are different. As a result, the penalty value is set to "2". If they are the same, the penalty value is set to "1". For the combination numbered 1, it is seen from the part table shown in FIG. 2 that all supply devices are supply cassettes whose width is 8 mm. With this process, the penalty value "1" is set, and it is multiplied by the total number, so that the same supply evaluation "14" is obtained.

Then, the overall evaluation obtained by adding up these evaluation levels "34" is obtained. It is divided by the total number "14" and the evaluation level "2.43" is obtained. As described above, for example, a plurality of columns to which evaluation levels explained in steps H7 and H8 of FIG. 7 are written are arranged between the "same supply evaluation" column and the "overall evaluation" column. Because all supply devices are supply cassettes in this example as shown in the part table of FIG. 2, there is no data to be written to these columns. Therefore, they are not shown in the drawings since they are empty.

The above described evaluation process is further performed for the combination numbered 2. In this case, only the difference from the above described process is the "same supply evaluation" column. Parts whose supply devices are different at the time of simultaneous pick up among the parts AAA, BBB, CCC and III of this combination are the part CCC (whose supply device is a supply cassette having an 8 mm-width, and its number is 3) and the part III (whose supply device is a supply cassette having a 12 mm-width, and its number is 1). The number of parts at the time of simultaneous pick up "1+1=2" is multiplied by the penalty value "2". The result is "4". The simultaneous absorption number 12 of the remaining parts is multiplied by the penalty value "1". The result is "12". The number of the remaining parts at the time of simultaneous pick up "12" is multiplied by the penalty value "1", and its result is "12". By adding these resultant values, the same supply evaluation level "16" is obtained. The overall evaluation of this combination is "36", and the evaluation level is "2.57". Similarly, the process for obtaining the evaluation level is performed for each of the combinations up to No.8, as shown in FIG. 12. Then, the combination whose evaluation is the highest (that is, the evaluation level is the lowest) is extracted as the optimum combination.

Figure 13:
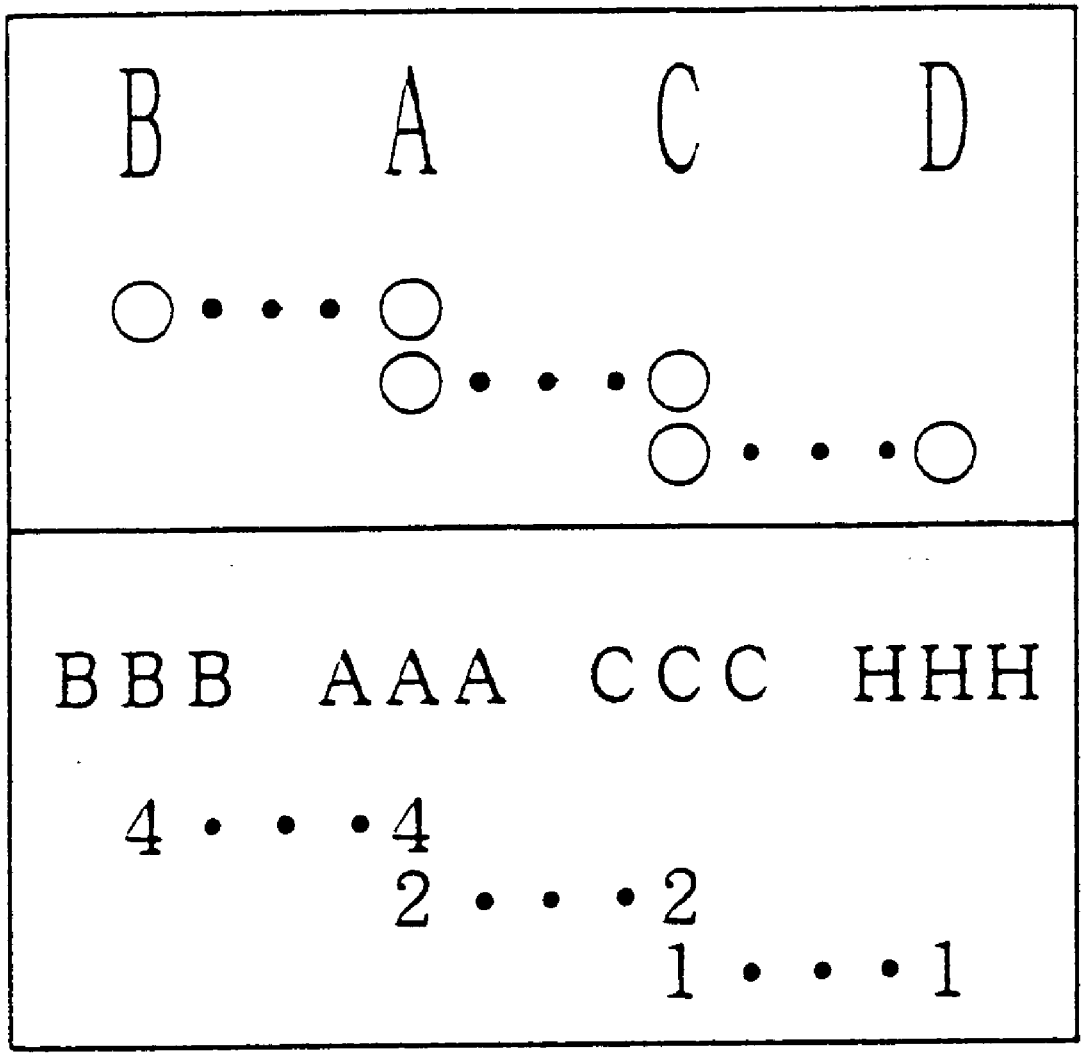
FIG. 13 is a schematic diagram showing an actual pick up state implemented according to an optimum combination indicated by an identifier P1221 by making a correspondence between a part number and the number of parts to be picked up.

FIG. 13 is a schematic diagram showing an actual pick up state implemented by using the optimum combination which is represented by the identifier P1221 and is extracted as described above, in correspondence with the part numbers and the number of parts to be picked up. Note that other combinations are removed from the record.

The above described combination search, writing operations to the evaluation table, evaluation operations and extraction of the optimum combination are similarly performed for the combinations represented by the identifiers shown in FIGS. 5, 8 through 10, 11B and 11C, although these operations are not shown in the drawings. Also the combinations represented by the identifiers shown in FIGS. 14 through 16, which will appear later, are similar.

FIG. 14 shows three examples of the search conditions for combinations of four parts to be picked up by two heads. Their identifiers are P12221_1, P14111_1 and P41111_1. They must be shown in respective drawings like those shown in the previous FIGS. 11A, 11B and 11C. However, they are shown in one table altogether as the space is limited. For the operating condition, pick up state illustration, quantity condition and the pick up condition of each of the identifiers, the symbols, mathematical expressions and descriptions, which are explained earlier in this specification, are used. Therefore, their explanations are omitted here.

FIG. 15 shows four examples of search conditions for combinations of five parts to be picked up by two heads. Their identifiers are P12221, P14111, P11411 and P41111. Also they must be shown in respective drawings, but they are exhibited all together in one drawing as the space is limited. In this case, the operating condition is common to the identifiers P14111 and P11411; the quantity condition is common to the identifiers P14111, P11411 and P41111; and part of the pick up conditions is common to the identifiers P14111, P11411 and P41111. Since the symbols, mathematical expressions and descriptions, which were explained earlier in this specification, are used for the operating conditions pick up state illustration, quantity condition and the pick up condition of each of the identifiers, their explanations are omitted here.

FIGS. 16A and 16B show two examples of combinations with the lowest efficiency among the combinations to be picked up by two heads (however, they might be adopted depending on a case). FIG. 16A shows the search conditions for a combination of four parts to be picked up by two heads, while FIG. 16B shows the search conditions for a combination of one part to be picked up by two heads. These are combinations searched from the process in step S10-(m-1)-1 to the process in step S10-m-2. Processes similar to those shown in FIGS. 6 and 7 are performed for these combinations, and an evaluation table similar to that shown in FIG. 12 is generated. As a result, the optimum combination is extracted.

In step S11 of FIG. 3, the combination whose evaluation is the highest among the optimum combinations extracted for respective combinations represented by respective identifiers, is determined (the other combinations are removed). Then, it is determined whether or not its evaluation level is equal to or lower than a predetermined standard value (step S12). This is the process performed when the total number of parts decreases as the determination process for determining a final combination, which will be described later, proceeds.

If the evaluation level is equal to or lower than the standard value ("Y" in step S12), that combination is finally determined and stored in a predetermined area in the RAM 4. Then, the parts and their pick up quantities, which will form the combination, are excluded from the part table shown in FIG. 2. A part table composed of the remaining parts is newly set, and the process starts from step S1 based on this newly set part table.

If the evaluation level is higher than the standard value in step S12 ("N" in step S12), the above described combination, which was determined as the combination whose evaluation is the highest, is destroyed, and "1" is assigned to the remainder register (step S13). With this process, the value of the remainder register whose value is initially set to "0" is changed to "1". Next, it is determined whether or not the current value of the remainder register is equal to or smaller than an allowable value of the remainder in the case of two heads (step S14). According to this preferred embodiment, the value of the remainder may be up to "1" as described above. Because the current value is equal to or smaller than the allowable value of the remainder in this case ("Y" in step S14), the process goes back to step S10. The process in steps S10 through S14 is then performed.

Consequently, if an optimum combination is not found among the combinations to be picked up by two heads when the remainder is "0", combinations to be picked up by two heads when the remainder is "1" are started to be searched. That is, only combinations whose quantity conditions include "+remainder" are searched in the process performed in step S10-1-1 of FIG. 4, which is again performed. Then, the optimum combination among the combinations with the remainder is determined in step S11. In step S12, if its evaluation level is equal to or smaller than the standard value, it is determined as the final combination, and registered to (stored in) the RAM 4. Then, this combination is excluded from the part table, and the process is resumed from step S1 based on the newly set part table.

If the evaluation level is larger than the standard value in step S12, the above described determined combination is destroyed and "1" is added to the value of the remainder register in step S13. With this process, the value of the remainder register is changed to "2". Since the value of the remainder register is higher than the allowable value of the remainder when two heads are used ("N" in step S14) in this case, the process goes to step S15 where a combination represented by the identifier P1 is generated (actually, not a combination but the extraction of corresponding parts). The process then goes to step S16 where the evaluation table of the generated combination is evaluated.

Figure 17:
FIG. 17 is a schematic diagram showing the search conditions of a combination indicated by an identifier P1.

FIG. 17 is a table showing the search conditions for the above described combination represented by the identifier P1. The operating condition is that "one part is (can be) picked up by one head". The quantity condition is "none". The pick up condition is that "a nozzle picking up the part A exists (is contained in a nozzle holder). Even if the parts cannot be efficiently picked up by three heads or two heads, a more efficient method for picking up parts using one head is searched under these conditions. The optimum procedure for picking up 11 of the parts shown in the part table of FIG. 2 is registered to a predetermined area in the RAM 4.

Although the order of the explanations is reversed, the process in steps S2 through S7 of FIG. 3 and the process in step S3-1-1 through S3-n-2 are similar to the above described processes in steps S9 through S14 of FIG. 3 and that from step S10-1-1 through S10-m-2. The only difference is that the number of heads to be used is three.

Figure 18:
FIG. 18 is a schematic diagram showing an example of a combination of three parts to be picked up by three heads.
Figure 28:
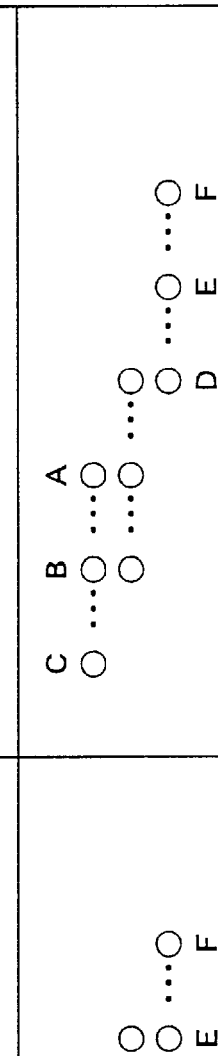
FIG. 28 is a schematic diagram showing two other examples of search conditions for combinations of six parts to be picked up by three heads.
Figure 29:
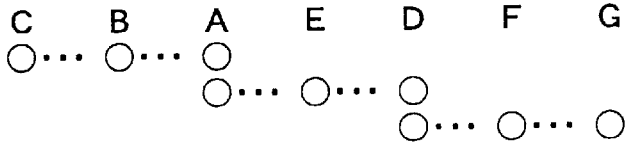
FIG. 29 is a schematic diagram showing an example of search conditions for a combination of seven parts to be picked up by three heads.

FIGS. 18 through 20 show ten examples of the search conditions for combinations of three parts to be picked up by three heads in the process performed in step S3-1-1 through S3-n-2 of FIG. 4A. FIGS. 21 through 23 show six examples of the search conditions for combinations of four parts to be picked up by three heads. FIGS. 24 through 27 show 10 examples of the search conditions for combinations of five parts to be picked up by also three heads. FIG. 28 shows two examples of the search conditions for combinations of six parts to be picked up by also three heads. FIG. 29 shows one example of the search conditions for a combination of seven parts to be picked up by also three heads.

If six or seven parts are picked up by three heads, it is empirically proved that the efficiency of a combination deteriorates severely if all of them cannot be picked up simultaneously. The reason why search conditions other than the condition that all of the parts can be picked up simultaneously are not provided to the CPU 1 when the number of parts to be picked up by three heads is six or seven, is due to the above described empirical rule.

The combinations of two parts to be picked up by three heads shown in FIGS. 30A and 30B are combinations with rather low efficiency among the combinations to be picked up by three heads. FIGS. 30A and 30B show the four examples. FIG. 30C shows one example of the last combination of one part to be picked up by three heads with the lowest efficiency, which might be adopted depending on a case. The process for searching for the combination on the right side of FIG. 30B and the combination shown in FIG. C is performed in step S3-(n-1)-1 through S3-n-2 of FIG. 4A.

Provided last is the explanation about "%" included in the quantity condition shown in FIGS. 19, 20 etc. "%2" included in "(A−B)%2" shown in FIG. 19 indicates the remainder of "2". That is, "(A−B)%2" indicates the remainder when "2" is subtracted from (A−B). If (A−B) is an even number, "(A−B)%2" is "0". If "(A−B)" is an odd number, "(A−B)%2" is "1". Also "(A−B)%3" shown in FIG. 20A is similar. This indicates the remainder when "3" is subtracted from "(A−B)". Furthermore, "!=" included in "!=1" immediately following "%3" is a symbol representing "Not Equal". That is, it represents that both sides are not equal. "*" included in the quantity condition shown in FIG. 19B is equivalent to "x".

For the other search conditions such as the operating condition, quantity condition, pick up state illustration and the pick up condition, the symbols, mathematical expressions and descriptions which were explained earlier in this specification, are used. Therefore, their explanations are omitted here.

As described above, once combinations which can efficiently pick up all parts are sequentially registered to the RAM 4, use of the combination data registered to the RAM 4 instead of manually input combination data allows a part mounting program with higher efficiency to generate easily.

What is claimed is:

1. A parameter generating device for a part mounting program, comprising:

a storing means for storing a part table composed of at least a part type, a number of parts, a supply type of the part and a picking-up nozzle to be used;

a generating means for generating a combination of parts to be picked up by a plurality of heads based on the part table stored in said storing means;

an evaluating means for giving an evaluation level of operation efficiency of pick up of the parts according to the combination generated by said generating means, to each combination; and a selecting/registering means for selecting and registering a combination whose evaluation level given by said evaluating means is the highest among combinations.

2. A parameter generating method for a part mounting program, which is intended for generating an optimum combination of parts to be simultaneously picked up by using a programmed computer, comprising the steps of:

storing a part table composed of at least a part type, a number of parts, a supply type of the part, a picking-up nozzle to be used;

generating a combination of parts to be picked up by a plurality of heads based on the part table stored in the part table storing step;

giving an evaluation level of operation efficiency of pick up of the parts according to the combination generated in the combination generating step to each combination; and selecting and registering a combination whose evaluation level is the highest among combinations.

3. A storage medium storing a program for generating parameters for a part mounting program, the program generating an optimum combination of parts to be simultaneously picked up, and making a computer perform the functions of:

storing a part table composed of at least a part type, a number of parts, a supply type of the part and a picking-up nozzle to be used;

generating a combination of parts to be picked up by a plurality of heads based on the part table;

giving an evaluation of operation efficiency of pick up of the parts according to the combination, to each combination;

selecting and registering a combination whose given evaluation level is the highest among combinations;

excluding selected parts from the part table; and generating a combination picking up all parts included in the part table by repeating the process including the generating operation of the combination to be picked up, the giving operation of the evaluation level to each combination, the selecting and registering operations of the combination whose evaluation level is the highest and the excluding operation of the selected parts from the part table.

* * * * *